(12) United States Patent
Tanaka et al.

(10) Patent No.: US 6,535,435 B2
(45) Date of Patent: Mar. 18, 2003

(54) REFERENCE VOLTAGE GENERATOR PERMITTING STABLE OPERATION

(75) Inventors: Hitoshi Tanaka, Ome (JP); Masakazu Aoki, Tokorozawa (JP); Shinichiro Kimura, Kunitachi (JP); Hiromasa Noda, Tokyo (JP); Tomonori Sekiguchi, Kokubunji (JP)

(73) Assignees: Hitachi, Ltd., Tokyo (JP); Hitachi ULSI Systems Co., Ltd., Kodaira (JP)

( * ) Notice: Subject to any disclaimer, the term of this patent is extended or adjusted under 35 U.S.C. 154(b) by 0 days.

(21) Appl. No.: 10/012,522

(22) Filed: Dec. 12, 2001

(65) Prior Publication Data

US 2002/0041531 A1 Apr. 11, 2002

Related U.S. Application Data

(63) Continuation of application No. 09/446,025, filed as application No. PCT/JP98/02147 on May 15, 1998, now Pat. No. 6,335,893.

(30) Foreign Application Priority Data

Jun. 16, 1997 (JP) ................................................ 9-175310

(51) Int. Cl.[7] ................................................. G11C 7/00
(52) U.S. Cl. ................... 365/189.09; 365/175; 365/179
(58) Field of Search ........................... 365/189.09, 175, 365/179; 323/313, 315; 327/534, 535, 538, 539

(56) References Cited

U.S. PATENT DOCUMENTS

| | | | | |
|---|---|---|---|---|
| 5,061,862 A | * | 10/1991 | Tamagawa | ............... 307/296.1 |
| 5,377,138 A | | 12/1994 | Hiroshi et al. | ............... 365/154 |
| 5,686,823 A | * | 11/1997 | Rapp | ......................... 323/313 |

FOREIGN PATENT DOCUMENTS

| | | |
|---|---|---|
| JP | 2-70264 | 3/1990 |
| JP | 7-57461 | 3/1995 |
| JP | 7-57465 | 3/1995 |
| JP | 7-307091 | 11/1995 |
| JP | 8-63964 | 3/1996 |
| JP | PCT-98-02147 | 5/1998 |
| JP | 10-134570 | 5/1998 |

* cited by examiner

Primary Examiner—Vu Anh Le
(74) Attorney, Agent, or Firm—Antonelli, Terry, Stout & Kraus, LLP

(57) ABSTRACT

A reference voltage generation circuit is provided which includes a p-channel type MOSFET used as an input transistor to allow a sufficient current to flow through a differential amplifier even if the threshold voltages of MOSFETs used in the differential amplifier significantly increase. A push-pull conversion circuit is coupled to the differential amplifier and has a double end configuration to provide a sufficiently high level to drive a p-channel output buffer. This arrangement allows a stable operation at a sufficiently low power supply voltage even if the threshold voltages of the MOSFETs forming the differential amplifier are high. It also allows quick activation when the power is turned on and provides high stability.

3 Claims, 28 Drawing Sheets

REFERENCE VOLTAGE GENERATOR PERMITTING STABLE OPERATION

This is a continuation of application Ser. No. 09/446,025, filed Dec. 16, 1999 U.S. Pat. No. 6,335,893, which is a 371 of PCT/JP98/02147 filed May 15, 1998, the entire disclosure of which is hereby incorporated herein by reference.

TECHNICAL FIELD

The present invention relates to semiconductor integrated circuit devices and, more particularly, to a technique which is effectively applied primarily to power supplying techniques for dynamic RAMs (random access memories).

BACKGROUND OF THE INVENTION

In order to increase the information retention time of memory cells of a dynamic RAM, the impurity concentration of the substrate must be reduced to reduce the electric field of a p-n junction formed between source and drain diffusion layers of a MOSFET for address selection and the substrate. Such a reduction of the substrate impurity concentration results in a decrease of the threshold voltage of the MOSFET, which in turn results in an increase in the leakage current between the source and drain when the gate voltage is at a non-select level, such as ground potential. As a solution to this problem, it has been proposed to set the non-select level of word lines to which a gate is connected at a negative voltage. The negative voltage is obtained using a charge pump circuit and is stabilized by controlling an oscillation circuit for providing an intermittent oscillation with a level sensor. Examples of dynamic RAMs in which the non-select level of the word lines is set at a negative voltage to improve the information retention time are disclosed in Japanese unexamined patent publications No. H2-5290, No. H6-255566, No. H7-57461 and No. H7-307091.

A substrate voltage undergoes a relatively significant potential fluctuation, e.g., in the range from 10 to 30%, attributable to capacitive coupling between bit lines and word lines and itself when the bit lines and word lines undergo level changes between select and non-select levels. It has therefore been found that, when it is attempted to use a negative back bias voltage supplied to a substrate voltage by a charge pump circuit as the non-select level of word lines, as described above, discharge is caused by capacitive coupling, as described above, and a current flows to pull the select level of the word lines to the non-select level, and so the discharge can cause a temporary shortage of the non-select level of the word line, which is a major cause of deterioration of information retention characteristics. In order to solve this problem, improvements in the internal power supply circuits were pursued to allow them to operate with stability.

It is therefore an object of the invention to provide a semiconductor integrated circuit device having an internal power supply circuit which operates with stability. It is another object of the invention to provide a semiconductor integrated circuit device including a dynamic RAM which has an increased storage capacity and improved information retention characteristics. It is still another object of the invention to provide a semiconductor integrated circuit device which has higher reliability and operating speed and lower power consumption. The above-described and other objects and novel features of the invention will become more clear from the description provided in this specification and from the accompanying drawings.

DISCLOSURE OF THE INVENTION

According to the invention, there is provided a semiconductor integrated circuit comprising a first circuit block operating on a power supply voltage supplied through an external terminal and a second circuit block operating on an internal voltage generated by a power supply circuit, in which the internal voltage is generated by generating a voltage having a greater absolute value than that of the internal voltage using a charge pump circuit, and in which variable impedance means is provided between the output voltage and the internal voltage and the variable impedance means is controlled to compare and cause a reference voltage and the internal voltage to agree with each other using a differential amplifier circuit operating on the output voltage generated by the charge pump circuit.

BEST MODE FOR CARRYING OUT THE INVENTION

The present invention will now be described in detail with reference to the accompanying drawings.

Figure 1:
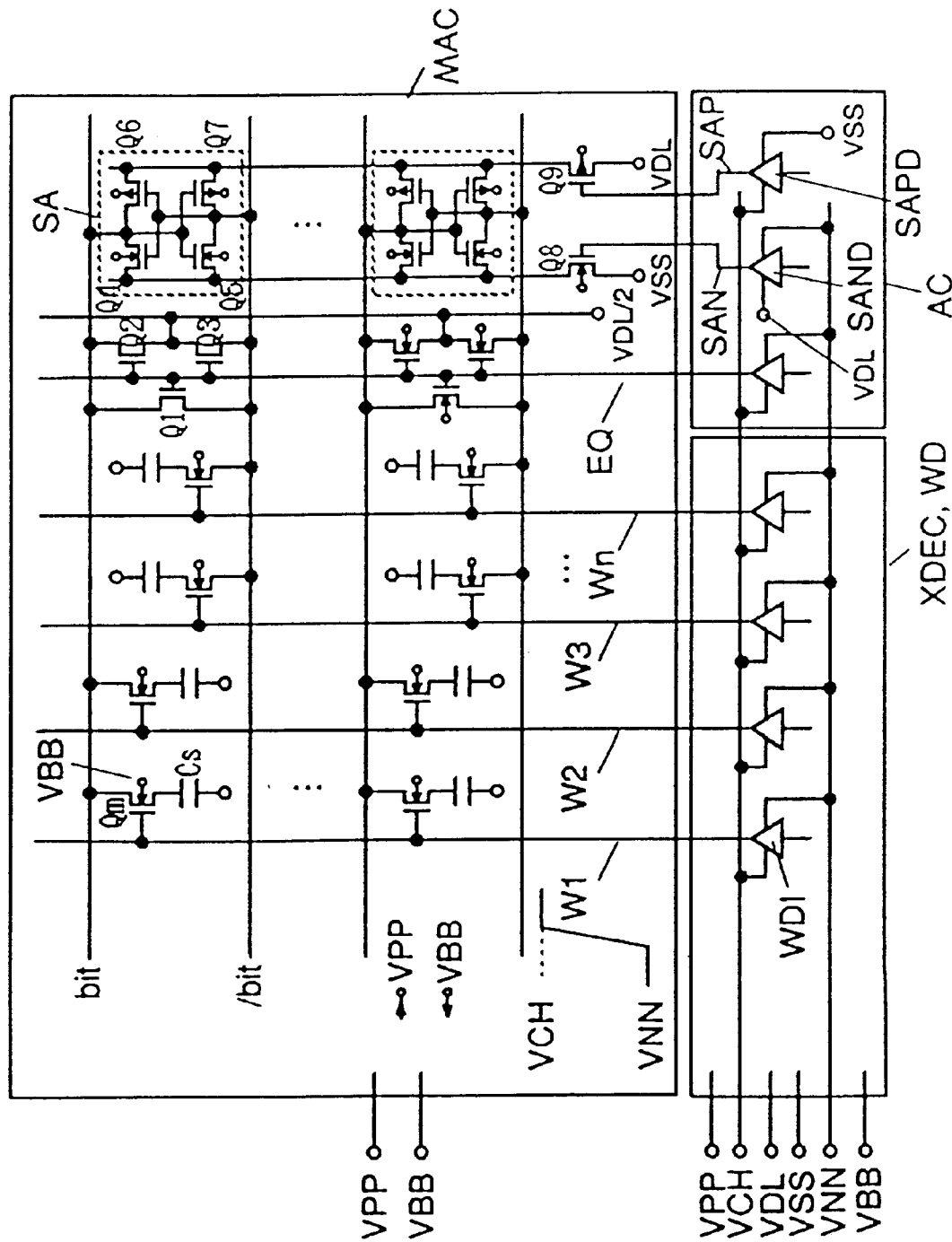
FIG. 1 is a schematic circuit diagram of an embodiment of a memory array portion of a dynamic RAM according to the invention.
Figure 2:
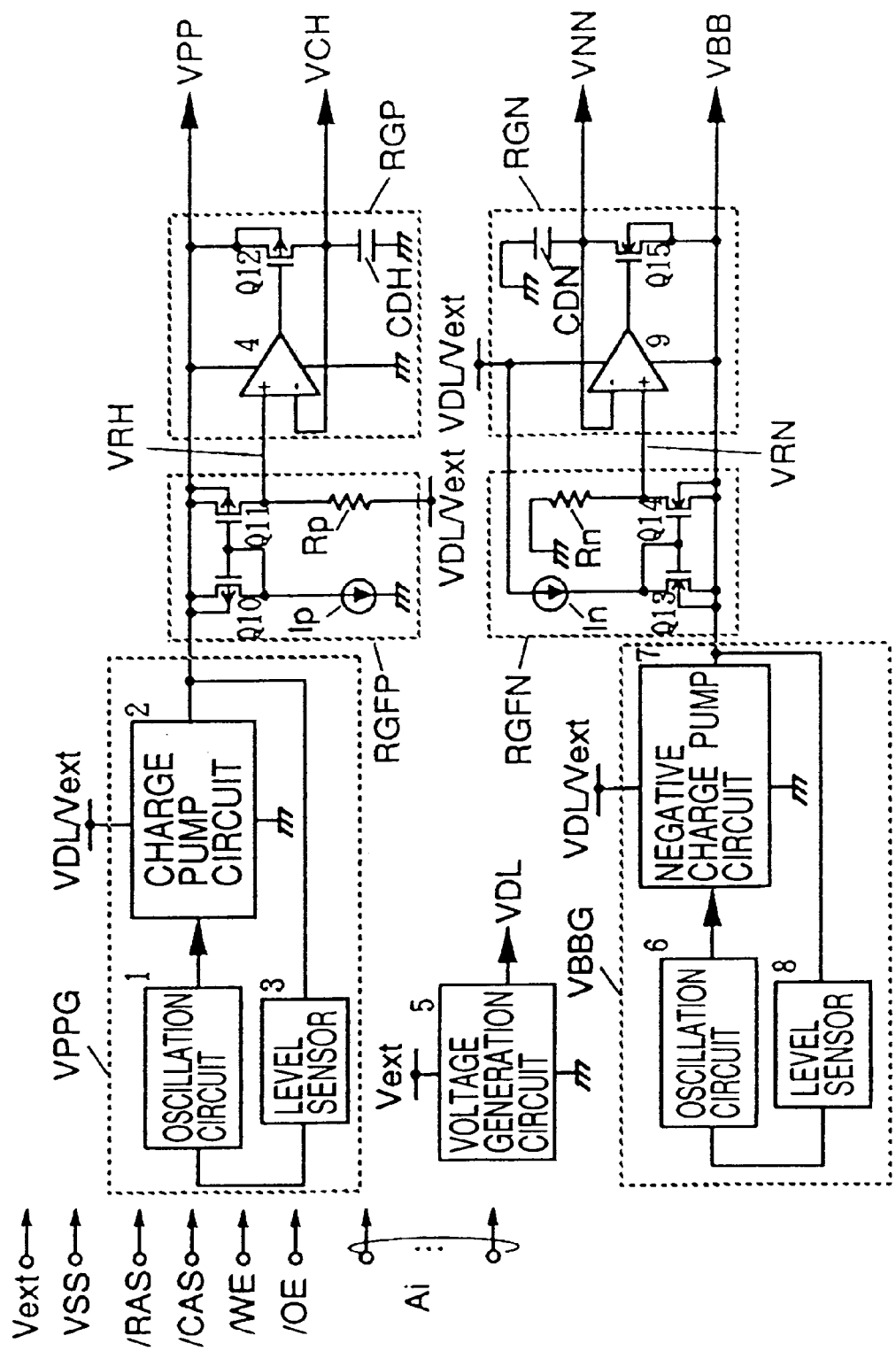
FIG. 2 is a schematic circuit diagram of an embodiment of a power supply circuit of a dynamic RAM according to the invention.

FIGS. 1 and 2 show schematic circuit diagrams of embodiments of part of a dynamic RAM according to the invention. FIG. 1 shows a memory array portion, and FIG. 2 shows a power supply circuit. Those figures omit an input/output interface for addresses and data, a selection circuit for the column system, a control circuit and the like that form the dynamic RAM.

FIG. 1 shows eight exemplary dynamic memory cells which are provided between word lines W1, W2, W3, . . . Wn and either of two p airs of complementary bit lines "bit" and "/bit", i.e., "bit" or "/bit" provided in one memory array MAC shown as a typical example. A dynamic memory cell is constituted by an address selection MOSFET Qm and a storage capacitor Cs. An address selection MOSFET Qm is connected to the word line W1 or the like associated therewith at the gate thereof, to the bit line "bit" or the like at the drain thereof and to a storage capacitor Cs at the source thereof. The other electrodes of the storage capacitors Cs are commonly supplied with a plate voltage.

The select level of the word lines W1 and the like of the dynamic RAM of the present embodiment is a high voltage VCH which is higher than a high level at the bit line "bit" and the like by an amount corresponding to the threshold voltage of the address selection MOSFET Qm. The non-select level of the word lines is a low voltage VNN which is lower than the ground potential VSS of the circuit.

When a sense amplifier to be described later operates on an internal low voltage VDL, the high level supplied to the bit lines after being amplified by a sense amplifier SA to be described below is a level which corresponds to the internal voltage VDL. Therefore, the high voltage VCH corresponding to the select level of the word lines is a high voltage, such as VDL+Vth. An input/output node of the sense amplifier SA is connected to the pair of complementary bit lines "bit" and "/bit". The complementary bit lines "bit" and "/bit" are provided so as to extend in parallel as shown in FIG. 1 and are appropriately crossed as needed in order to achieve balance of capacitance and the like. Such complementary bit lines "bit" and "/bit" are connected to input and output nodes of a unit circuit of the sense amplifier SA by a shared switch MOSFET when the sense amplifier SA employs the shared sense system.

A unit circuit of the sense amplifier SA is formed by n-channel type amplifier MOSFETs Q4 and Q5 and p-channel type amplifier MOSFETs Q6 and Q7 whose gates and drains are cross-connected to form a latch configuration. The sources of the n-channel type MOSFETs Q4 and Q5 are connected to a common source line, and the ground potential VSS of the circuit is supplied to such a common source line through an nchannel type power switch MOSFET Q8 at the timing of operation of the sense amplifier. The sources of the p-channel type MOSEETs Q6 and Q7 are connected to a common source line, and the internal low voltage VDL is supplied to such a common source line through a p-channel type power switch MOSFET Q9 at the timing of operation of the sense amplifier.

Referring to the operational voltage of the sense amplifier at the high level side, over-driving may be employed such that a high voltage like the voltage VCH is temporarily supplied during the period after the beginning of an amplifying operation and before an amplification signal on the bit lines reaches the voltage VDL in order to achieve a high speed operation of the sense amplifier, although this is not required by the invention. Specifically, a p-channel MOSFET may be provided in parallel with the MOSFET Q9, and such a p-channel type MOSFET may be temporarily turned on at time an amplifying operation of the sense amplifier is started to supply the high voltage VCH.

An equalize MOSFET Q1 for shorting the complementary bit lines and a precharge circuit formed by switch MOSFETs Q2 and Q3 for supplying a half precharge voltage VDL/2 to the complementary bit lines "bit" and "/bit" are provided at the input/output node of a unit circuit of the sense amplifier. An equalize (or precharge) signal EQ is commonly supplied to the gates of the MOSFETs Q1 through Q3. A driver circuit for generating the equalize signal EQ has a select level at the voltage VCH similar to a word driver WD1, etc., for driving the word lines W1, W2, W3, . . . , Wn and has a non-select level at a negative voltage such as the voltage VNN.

A driver SAND for driving the power switch MOSFET Q8 for supplying the ground potential of the circuit to the sense amplifier SA operates at the internal voltage VDL and the negative voltage VNN to generate a driving signal SAN constituted by a high level like the internal low voltage and a low level like the negative voltage VNN. A driver SAPD for driving the power switch MOSFET Q9 for supplying the internal low voltage VDL to the sense amplifier SA generates a driving signal SAP constituted by a high level like the high voltage VCH and a low level like the ground potential VSS of the circuit.

A substrate voltage VBB which is a potential lower than the negative voltage VNN is applied to a p-type well region having a memory array MAC formed therein and is coupled to an n-type well region at the depth at which the p-type well region is formed, and a high voltage VPP higher than the high voltage VCH is applied to the n-type well region where p-channel type MOSFETs forming a sense amplifier as described above are formed, although this is not a requirement of the invention. Each of the voltages VBB and VPP is generated by a charge pump circuit as described later.

The operating voltages VCH, VDL, VSS and VNN are supplied to an X-decoder XDEC and to the word drivers WD for generating selection signals for the word line W1 and, etc., to a driver included in an array control circuit AC for generating the precharge signal EQ and to the drivers SAND and SANP for generating the driving signal for the sense amplifier. A high voltage VCPP, which serves as a bias voltage, is applied to an n-type well region where a p-channel type MOSFET that constitutes each of the drivers is formed, and the negative voltage VBB is applied to a p-well region or p-type substrate where an n-channel type MOSFET is formed.

Referring to FIG. 2, the high voltage VPP is generated by a high voltage generation circuit VPPG. The high voltage generation circuit VPPG is constituted by an oscillation circuit 1, a charge pump circuit 2 and a level sensor 3. The charge pump circuit 2 receives an oscillation pulse generated by the oscillation circuit 1 and performs a charge pump operation to generate a high voltage. The level sensor 3 performs a level sensing operation to stabilize the high voltage VPP at a predetermined high voltage level, thereby controlling the operation of the oscillation circuit 1 intermittently. Specifically, it stops the oscillating operation when the high voltage VPP reaches the predetermined high voltage level and causes the oscillation circuit 1 to operate when the high voltage VPP decreases.

The high voltage VPP is at a level higher than the high voltage VCH associated with the select level for the word line W1 and etc. For example, as shown in the operational waveform diagram in FIG. 3, when the word line select voltage VCH is set to 2.25 V, the high voltage VPP is set to a higher voltage of 2.6 V. Thus, a voltage higher than the required voltage VCH is generated, and a reference voltage generation circuit RGFP is operated based on such a high voltage VPP. The reference voltage generation circuit RGFP causes a constant current Ip to flow through a current mirror circuit formed by p-channel type MOSFETs Q10 and Q11 to a resistor Rp for which the internal voltage VDL (or external power supply voltage Vext) serves as a reference, thereby generating a voltage corresponding to the threshold voltage Vth of the address selection MOSFET Qm. There-fore, a reference voltage VRH is a voltage corresponding to VDL (or Vext)+Vth.

A constant voltage generation circuit RGP is constituted by a p-channel type MOSFET Q12, which operates as a variable resistance element provided between the high voltage VPP and internal high voltage VCH and a differential amplifier circuit 4 that receives the reference voltage VRH and internal high voltage VCH, and a signal output by the differential amplifier circuit 4 is supplied to the gate of the MOSFET Q12. When the internal high voltage VCH tends to decrease below the reference voltage VRH, a signal that changes to a low level is generated to decrease the resistance of the MOSFET Q12, which causes the voltages to agree with each other on the contrary, when the internal high voltage VCH tends to increase beyond the reference voltage VRH, a signal that changes to a high level is generated to increase the resistance of the MOSFET Q12, which causes the voltages to agree with each other.

The negative voltage VBB is generated by a negative voltage generation circuit VBBG. The negative voltage circuit VBBG is constituted by an oscillation circuit 6, a negative charge pump circuit 7 and a level sensor 8 as described above, and the charge pump circuit 7 receives an oscillation pulse generated by the oscillation circuit 6 and performs a charge pump operation to generate a negative voltage. The level sensor 8 performs a level sensing operation to stabilize the negative voltage VBB at a predetermined negative voltage level, thereby controlling the operation of the oscillation circuit 6 intermittently. Specifically, it stops the oscillating operation when the negative voltage VBB reaches the predetermined negative voltage level and causes the oscillation circuit 6 to operate again when the absolute value of the negative voltage VPP decreases.

The negative voltage VBB is set at a voltage having an absolute value higher than that of the negative voltage VNN associated with the non-select level for the word line W1, etc. For example, as shown in the operational waveform diagram in FIG. 3, when the non-select voltage VNN for the word lines is set at −0.75 V, the negative voltage VBB is set at a voltage such as −1.1 V which is higher in terms of absolute value. Thus, a voltage higher than the required voltage VNN in the negative direction is generated, and a reference voltage generation circuit RGFN similar to that described above is operated based on such a negative voltage VBB. The reference voltage generation circuit RGFN causes a constant current In to flow through a current mirror circuit formed by n-channel type MOSFETs Q12 and Q13 to a resistor Rn for which the ground potential VSS of the circuit serves as a reference, thereby generating a reverse bias voltage VRN to be applied between the gate and source of the address selection MOSFET Qm. In the present embodiment, the voltage VRN is set at a negative voltage like −0.75 V.

A constant voltage generation circuit RGN is constituted by a n-channel type MOSFET Q15, which operates as a variable element provided between the negative voltage VBB and internal negative VNN and a differential amplifier circuit 9 that receives the reference voltage VRN and internal negative voltage VNN, and a signal output by the differential amplifier circuit 9 is supplied to the gate of the MOSFET Q15. When the internal high voltage VNN tends to decrease below the reference voltage VRN, a signal that changes to a high level is generated to decrease the resistance of the MOSFET Q15, which causes the voltages to agree with each other, on the contrary, when the internal negative voltage VNN tends to increase beyond the reference voltage VRN, a signal that changes to low level is generated to increase the resistance of the MOSFET Q15, which causes the voltages to agree with each other.

A voltage regulator 5 receives an external voltage Vext supplied through an external terminal and generates the internal low voltage VDL at a circuit therein similar to the constant voltage generation circuit RGP. The voltage regulator 5 is not essential. Peripheral circuits including the sense amplifier and address selection circuit may operate on the external voltage Vext supplied through the external terminal. In this case, the level of the internal high voltage VCH is determined based on such an external voltage Vext as a reference. Even when the voltage regulator 5 is provided, the constant voltage VDL may be used as the operating voltage of the sense amplifier, and internal circuits such as an address buffer and an address decoder may operate on the external voltage Vext.

The voltages VPP and VBB generated by the above-described charge pump circuits 2 and 7 are maintained as charges accumulated in a parasitic capacity or the like and are changed significantly as described above by currents to charge up or discharge word lines having a relatively great parasitic capacity attributable to the connection of a multiplicity of memory cells, for example, when the word lines are switched from the non-select level to the select level or conversely from the select level to the non-select level. When the select and non-select levels are set taking such voltage changes into consideration, the gate insulation film of the address selection MOSFET connected to the word lines and the gate insulation film of the output MOSFET that constitutes the word driver for driving the word lines must have a high withstand voltage depending on the high voltage which is applied, taking the above-described level changes into consideration.

On the contrary, according to the invention, the select and non-select levels of the word lines are generated through the constant voltage circuits RGP and RGN as described above. As a result, when word lines are switched from the non-select level to the select level or conversely from the select level to the non-select level, the voltages VPP and VBB are similarly changed by currents to charge up and discharge word lines having a relatively great parasitic capacity attributable to the connection of a multiplicity of memory cells. However, since the resistance of the MOSFETs Q12 and Q15, which operate as variable resistors of the constant voltage circuits RGP and RGN, changes to absorb the voltage changes, the voltages VCH and VNN can be kept substantially constant.

The voltage difference between the internal high voltage VCH and the high voltage VPP and the voltage difference between the internal negative voltage VNN and the negative voltage VBB are defined to compensate for changes in the output voltages of the charge pump circuits 2 and 7, respectively, depending on the driving current for the word lines. Therefore, the voltages applied to the gate insulation films of the output MOSFET of the word driver WD and the memory cell address selection MOSFET are relatively low voltages which are determined by the stabilized voltages VCH and VNN, which eliminates the need for providing them with a high withstand voltage including an allowance to accommodate voltage changes as described above.

Figure 3:
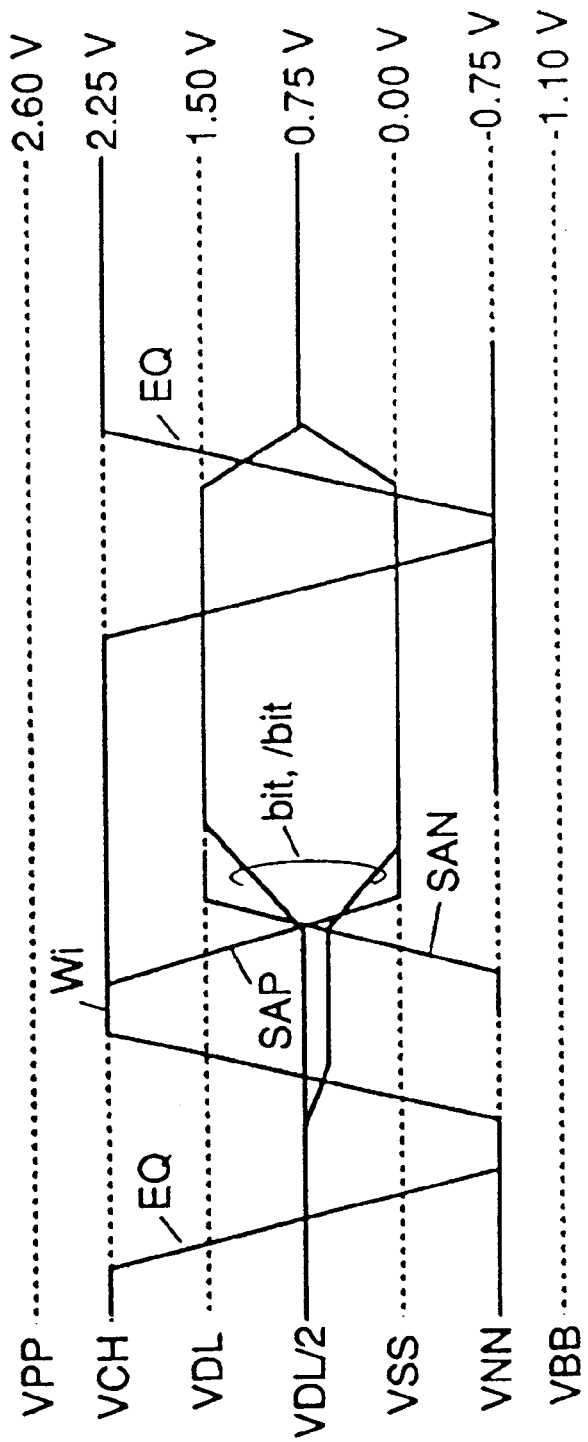
FIG. 3 is a waveform diagram schematically illustrating operations of a dynamic RAM according to the invention.

FIG. 3 shows a waveform diagram schematically illustrating operations of a dynamic RAM according to the invention. FIG. 3 primarily shows a memory cell selecting operation. The equalize signal EQ is at a high level like the internal high voltage VCH when the memory cell is in an information retention state. As a result, the MOSFETs Q1 through Q3 are turned on; the complementary bit lines "bit" and "/bit" are shorted; and the half precharge voltage VDL/2 is supplied. While no problem occurs on an operation itself, even if the level of the equalize signal EQ is a at low potential like VDL, because the complementary bit lines "bit" and "/bit" are at the half precharge voltage VDL/2, the use of the internal high voltage VCH as in the present embodiment makes it possible to set short the high and low levels on the complementary bit lines "bit" and '/bit" in a short time by decreasing the on resistance of the MOSFET Q1 to thereby set the intermediate potential VDL/2.

The equalize signal EQ changes from the high level to the low level when the memory is accessed. At this time, the low level of the equalize signal EQ is the negative voltage VNN rather than the ground potential of the circuit. The reason is that the flow of any leakage current between the drains and sources of the MOSFETs Q1 through Q3 is to be prevented by supplying the negative voltage VNN to the gates thereof in order to achieve a reduction of the threshold voltage for co-equalization at a higher speed.

A sense amplifier activation signal SAN is similarly set at the negative voltage VNN when the sense amplifier is in a non-operating state to prevent any leakage current from flowing through the power switch MOSFET Q8 to which the signal is supplied. Specifically, in order to increase the speed of the sense amplifier, the gate insulation film of the MOSFET Q8 is formed with a small thickness to achieve a low threshold voltage. A MOSFET having such a low threshold voltage allows a relatively great current to flow therethrough in an operating state, which makes the amplifying operation of the sense amplifier faster. This equally applies to the p-channel type MOSFET Q9. The signal is set at the internal high voltage VCH when the sense amplifier is in the nonoperating state to prevent any leakage current from flowing through the power switch MOSFET Q9 to which it is supplied.

After the equalize signal EQ is set at a non-select level like the negative voltage VNN, a word line Wi is put in a selected state at a high level like the internal high voltage VCH. As a result, the address selection MOSFET Qm of the memory cell is turned on, and charges are distributed between the information storage capacitor Cs and the parasitic capacity of the bit line "bit- or "−/bit" set at the half precharge potential VDL/2, which decreases the potential at the bit line connected to the memory cell as shown in FIG. 3, for example, when the information storage capacitor Cs has no charge.

The sense amplifier activation signal SAN is increased from the negative voltage VNN to the internal low voltage VDL as described above, and this turns the n-channel MOSFET Q8 on to provide an operating voltage at a low level like the ground potential of the circuit. The sense amplifier activation signal SAP is decreased from the internal high voltage VCH to the a low level like the circuit ground potential VSS, and this turns the p-channel MOSFET Q9 on to provide an operating voltage at a high level like the internal low voltage VDL. Since the MOSFETs Q8 and Q9 are set at a low threshold voltage by forming the gate insulation films thereof with a small thickness as described above, they allow a relatively great current to flow therethrough when turned on to increase the speed of the amplifying operation of the sense amplifier. The amplifying operation of the sense amplifier amplifies the potentials of the complementary bit lines "bit" and "/bit" to a high level like the internal low voltage VDL and a low level like the circuit ground potential by expanding the potential difference read from the memory cell.

As a result of the amplifying operation of the sense amplifier as described above, a low level associated with the above-described initial state of storage cnarges is rewritten in the storage capacitor Cs of the memory cell connected to the bit line "bit', or "/bit" depending on the operation of selecting the word line Wi in accordance with the high and low levels at the complementary bit lines "bit" and so "biter".

The termination of memory access causes a decrease from the internal high voltage VCH to the negative voltage VNN at the word line Wi; the equalize signal EQ is thereafter increased from the negative voltage VNN to the internal high voltage VCH; and the high and low levels at the complementary bit lines "bit" and "/bit" are thereby shorted to set the half precharge voltage VDL/2. The MOSFETs Q2 and Q3 are provided to prevent, the half precharge voltage VDL/2 thus generated from fluctuating due to a leakage current, and the half precharge voltage VDL/2 is transmitted to the complementary bit lines "bit" and "/bit" when they are on.

Figure 4:
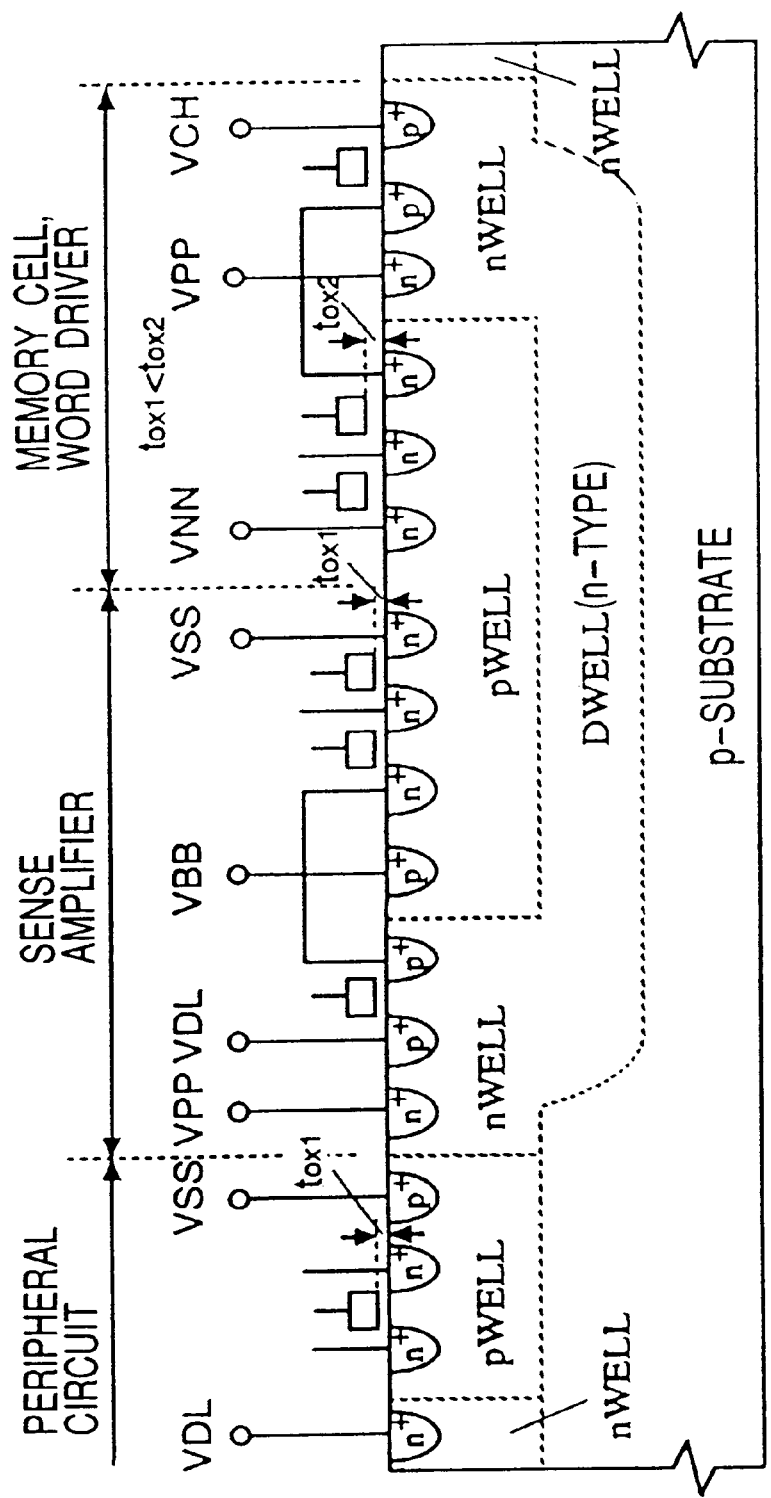
FIG. 4 is a schematic sectional view of an embodiment of an element of a dynamic RAM according to the invention.

FIG. 4 shows a schematic sectional view of an embodiment of an element of a dynamic RAM according to the invention. Each of the elements of the dynamic RAM of the present embodiment is formed with a triple well structure. Specifically, a deep n-type well region DWELL is formed on a p-type substrate, and a p-type well region pWELL is formed on such an n-type well region DWELL to form an address selection MOSFET for memory cells and an n-channel type MOSFET for a sense amplifier. The substrate back bias voltage VBB is applied to the p-type well region pWELL where memory cells are thus formed to increase the threshold voltage of the address selection MOSFET for an increased information retention time and to absorb minority carriers generated by rays or the like in such a p-type well region PWELL toward the substrate back bias voltage VBB also for an increased information retention time.

The n-type well region is formed such that it surrounds the p-type well region PWELL and such that it is in contact with the region DWELL to form p-channel MOSFETs that constitute the sense amplifier and the like. Peripheral circuits such as an X-decoder are formed in a p-type well region pWELL formed on the p-type substrate. In this configuration, memory cells and a word driver can be collectively formed in the region DWELL without providing any special device separation region because the region DWELL includes the region pWELL where the memory cells and the n-channel type MOSFET of the sense amplifier are formed, which allows a high level of integration.

In the present embodiment, the MOSFETs have two types of gate insulation films. The gate insulation films of the memory cell address selection MOSFET and the output MOSFET constituting the word driver are formed with a large thickness tox2. The gate insulation films of the MOSFETs that constitute the sense amplifier and peripheral circuits are formed with a smaller thickness tox1. The use of gate insulation films having two different thicknesses advantageously makes it possible to achieve both device reliability and operations at a higher speed. Specifically, when there is only one type of gate insulation film, the thickness of the gate insulation films is determined by the highest voltage applied thereto in order to maintain the reliability of the devices (to maintain the withstand voltage of the gate insulation films). Therefore, the threshold voltage of a circuit to which no high voltage is applied as described above becomes high, which reduces the current driving capability and consequently the operating speed of the same. This effect is significant especially for the peripheral circuits and sense amplifier which significantly depends on the driving capability of the MOSFETs.

In the present embodiment, the greater thickness tox2 is set for the address selection MOSFET which is supplied with a great signal amplitude such as the internal high voltage VCH and negative voltage VNN as described above at the gate thereof and for the output MOSFET for the word driver for generating an output signal having such a signal amplitude in order to prevent a voltage breakdown of the gate insulation films thereof. The smaller thickness tox1 is set for the MOSFETs of the sense amplifier and peripheral circuits to which only the internal low voltage VDL or the like is applied in order to increase the operating speed. This achieves both reliability of the devices and a higher operating speed as described above.

According to the present embodiment, a bias voltage like the circuit ground potential VSS is applied to the p-type substrate through the region pWELL formed thereon. The high voltage VPP generated by the charge pump circuit is applied to the region DWELL. The substrate back bias voltage VBB generated by the charge pump circuit is applied to the region pWELL formed in the region DWELL. With this configuration, the junction capacitance of the region DWELL and the junction capacitance of the region pWELL can be utilized as the voltage retention capacity of the charge pump circuits 2 and 7, respectively.

The internal high voltage VCH may be supplied to the region DWELL, and the negative voltage VNN may be applied to the region pWELL formed in the region DWELL. With this configuration, the junction capacitance of the region DWELL and the junction capacitance of the region pWELL can be utilized as the capacitors CDH and CDN for voltage stabilization provided at the output of the constant voltage circuits RGP and RGN shown in FIG. 2. Therefore, in the configuration in which the high voltage VPP is supplied to the region DWELL and the negative voltage VBB is supplied to the region pWELL formed in the region DWELL as in the figure, the capacitors CDH and CDN for voltage stabilization must be formed with MOS capacitance or the like at the output of the constant voltage circuits RGP and RGN.

Figure 5:
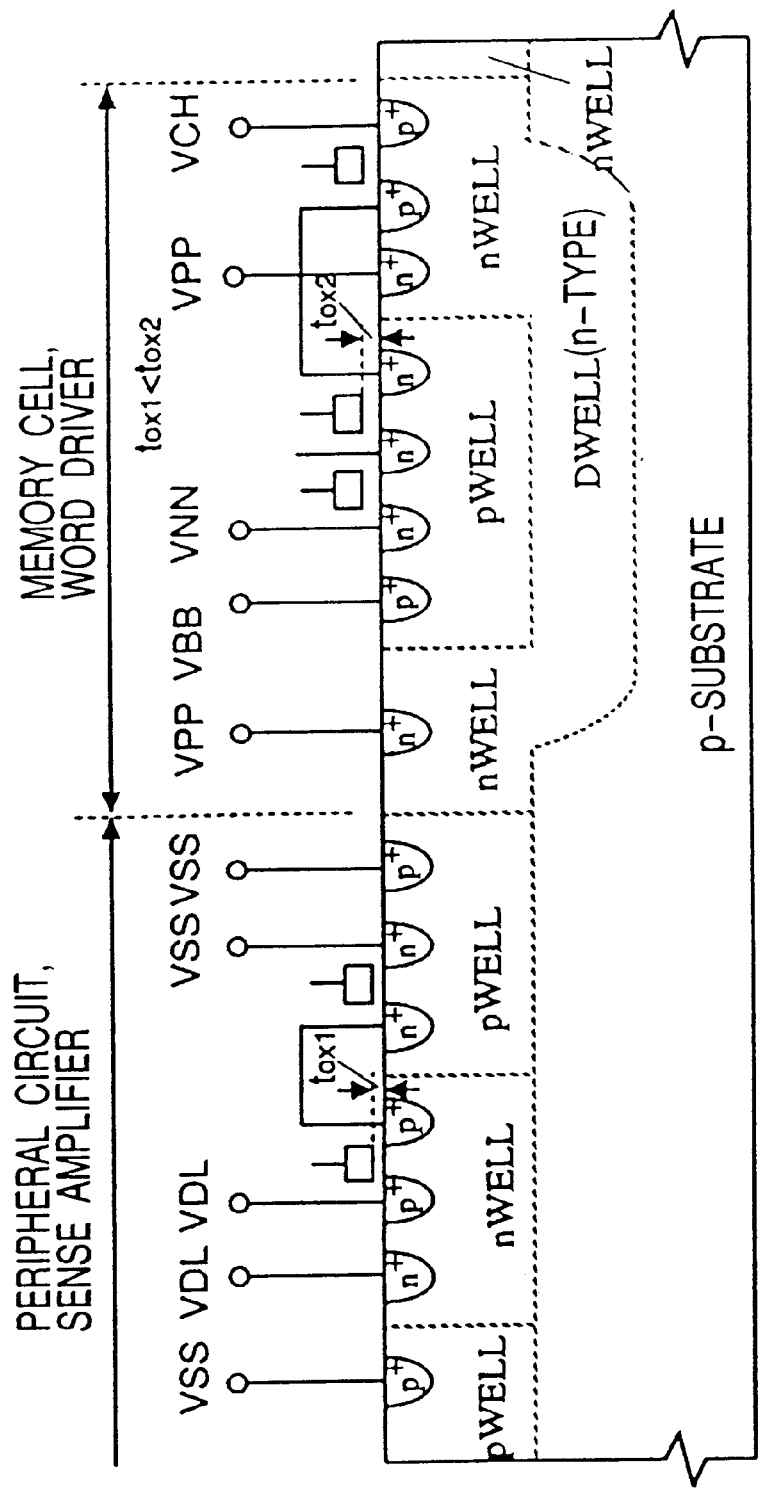
FIG. 5 is a schematic sectional view of another embodiment of an element of a dynamic RAM according to the invention.

FIG. 5 shows a schematic sectional view of an embodiment of an element of a dynamic RAM according to the invention. Each of the elements of the dynamic RAM of the present embodiment are formed with a triple well structure similar to that described above. Specifically, a deep n-type well region DWELL is formed on a p-type substrate, and a p-type well region pWELL is, formed on such an n-type well region DWELL to form an address selection MOSFET for memory cells. The substrate back bias voltage VBB is applied to the P-type well region pWELL where memory cells are formed to increase the threshold voltage of the address selection MOSFET for an increased information retention time and to absorb minority carriers generated by α-rays or the like in such a p-type well region pWELL toward the substrate back bias voltage VBB also for an increased information retention time.

In the present embodiment, an n-channel type MOSFET that constitutes a sense amplifier is formed in a p-type well region which is separated by the region DWELL from the p-type well where memory cells are formed. In this configuration, the circuit ground potential VSS is supplied instead of the substrate back bias voltage VBB for the memory cells described above to the p-type well region PWELL where the n-channel type MOSFET for the sense amplifier is formed. As a result, the threshold voltage of the n-channel MOSFET that constitutes the sense amplifier can be reduced because the back bias eliminates the effect of the substrate, which makes it possible to improve the driving capability of the same if the device size is kept unchanged, thereby increasing the operational speed of the sense amplifier.

Figure 6:
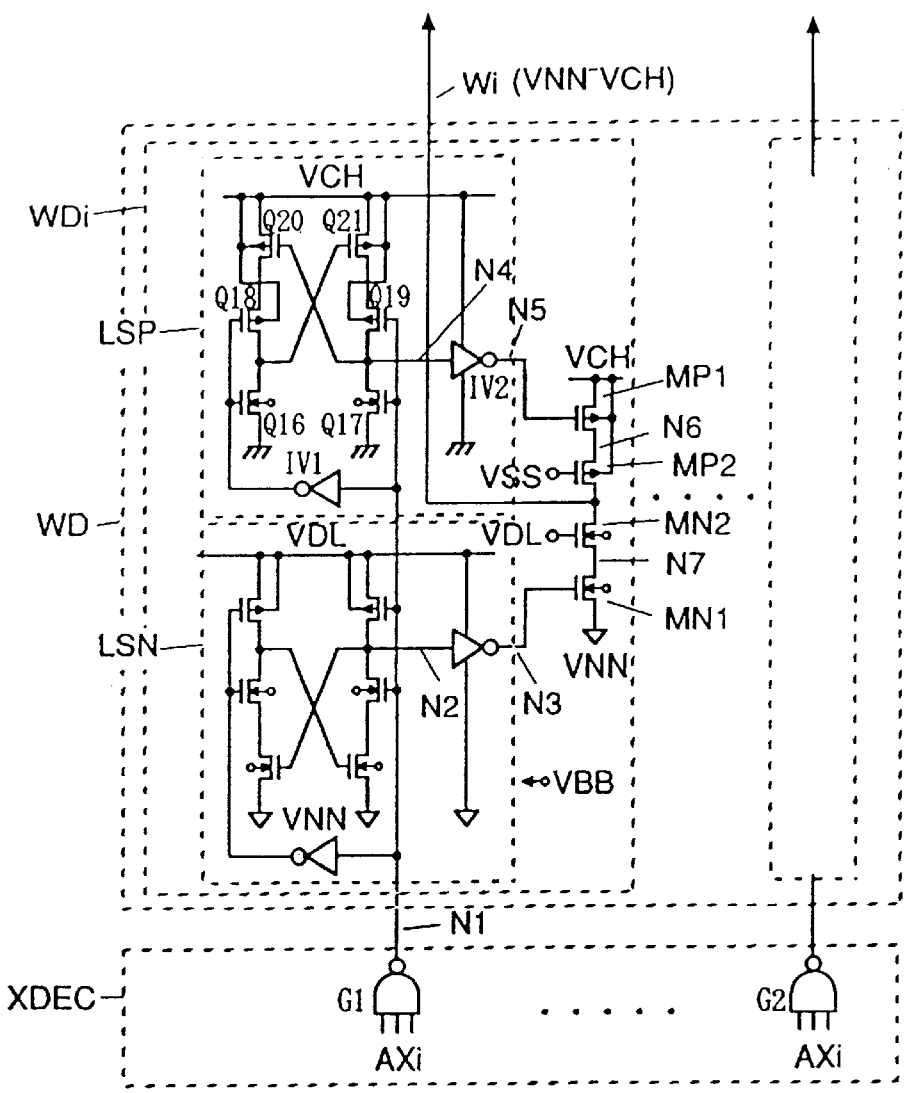
FIG. 6 is a circuit diagram of an embodiment of a word driver WD of a dynamic RAM according to the invention.

FIG. 6 shows a circuit diagram of an embodiment of the word drivers WD. FIG. 6 shows one word driver WDi associated with a word line Wi among the word drivers WD as a typical example. Logic circuits G1 and G2 and the like that constitute the X-decoder XDEC operate on the internal low voltage VDL and the circuit ground potential VSS as described above and generate a select/non-select output signal N1 having high and low levels.

Since the select and non-select levels for the word line Wi correspond to the internal voltage VCH and internal negative voltage VNN respectively, the output signal N1 of the X-decoder XDEC must be subjected to level, conversion to be associated with the voltages VDL and VSS. The present embodiment is designed to minimize the voltage applied to the gate of the output MOSFET in order to improve the reliability of the device, specifically, the output signal N1 is converted by two level conversion circuits LSP and LSN into two different levels. The level conversion circuit LSP generates a signal N5 to be supplied to the gate of an output MOSFET MP1 for generating a select level like the high voltage VCH from the output signal N1 of the X-decoder XDEC, and the level conversion circuit LSN generates a signal N3 to be supplied to the gate of an output MOSFET MN1 for generating a non-select level like the negative voltage VNN from the output signal N1 of the X-decoder XDEC.

The level conversion circuit LSP operates on the ground potential VSS and the high voltage VCH and includes a pair of CMOS inverter circuits formed by p-channel type MOSFETs Q18 and Q19 and n-channel type MOSFETs Q16 and Q17 and p-channel type MOSFETs Q20 and Q21 which are respectively connected in series to the channel type MOSFETs Q18 and Q19 and which are latched such that they are each supplied with the output signal from the other CMOS inverter circuit at the gates thereof to supply the high voltage VCH. The output signal N1 of the X-decoder XDEC is supplied to the gates of the MOSFETs Q17 and Q19 that form one of the CMOS inverter circuits and is inverted by an inverter circuit IV1 to be supplied to the gates of the MOSFETs Q16 and Q18 that form the other CMOS inverter circuit.

An output signal N4 from the first inverter circuit is supplied to the input of a CMOS inverter circuit. IV2 which operates as a driver, and an output signal N5 of the inverter circuit IV2 is supplied to the gate of the p-channel type output MOSFET MP1 to drive the output MOSFET MP1. Although the inverter circuit IV1 is shown as a part of the level conversion circuit LSP, it actually has the role of only generating a signal which is the inversion of the output signal of the X-decoder XDEC. Therefore, while the level conversion circuit LSP operates on the high voltage VCH and the circuit ground potential VSS as described above, the inverter circuit IV1 operates on the internal low voltage VDL and ground potential VSS similar to the X-decoder XDEC.

The level conversion circuit LSN has the same circuit configuration as that of the level conversion circuit LSP. The difference exists only in that the p-channel type MOSFETs and n-channel type MOSFETs are reversed to provide latched MOSFETs on the side of the n-channel type MOSFETs and in that the operating voltage at the higher level is the internal low voltage. VDL rather than the internal high voltage VCH and the operating voltage at the lower level is the internal negative voltage VNN rather than the circuit ground potential VSS. Specifically, the level conversion circuit LSN operates on the internal low voltage VDL and internal negative voltage VNN and includes a pair of CMOS inverter circuits formed by p-channel type MOSFETs and n-channel type MOSFETs similar to those described above and n-channel type MOSFETs which are respectively connected in series to the p-channel type MOSFETs and which are latched such that they are each supplied with the output signal from the other CMOS inverter circuit at the gates thereof to supply the internal negative voltage VNN.

The output signal NI of the X-decoder XDEC is supplied to the gates of the MOSFETs that form one of the CMOS inverter circuits as described above and is inverted by an inverter circuit so as to be supplied to the gates of the MOSFETs that form the other CMOS inverter circuit. An output signal N2 from the first inverter circuit is supplied to the input of a CMOS inverter circuit which operates as a driver, and an output signal N3 of the inverter circuit is supplied to the gate of the n-channel type MOSFET MN1 to drive the output MOSFET MN1.

In the present embodiment, in order to decrease a voltage applied between the gates and drains of the output MOSFETs MP1 and MN1, in other words, in order to reduce stress acting on the gate insulation films of the MOSFETs MP1 and MN1, a p-channel type MOSFET MP2 and an n-channel type MOSFET MN2 are connected in series between those MOSFETs and respective output terminals connected to the word line Wi. The ground potential VSS is applied to the gate of the p-channel type MOSFET MP2 to keep it on steadily, and the internal low voltage VDL is applied to the gate of the n-channel MOSFET MN2 to keep it on steadily.

The level conversion circuit LSP generates a driving signal N5 having a signal amplitude like the voltages VCH and VSS as described above to control the on and off states of the output MOSFET MP1. The p-channel MOSFET MP2 maintains the drain voltage of the output MOSFET MP1 at the ground potential VSS plus VT (VT represents the threshold voltage of the MOSFET MP2) even when the word line Wi is at the negative voltage VNN.

Figure 7:
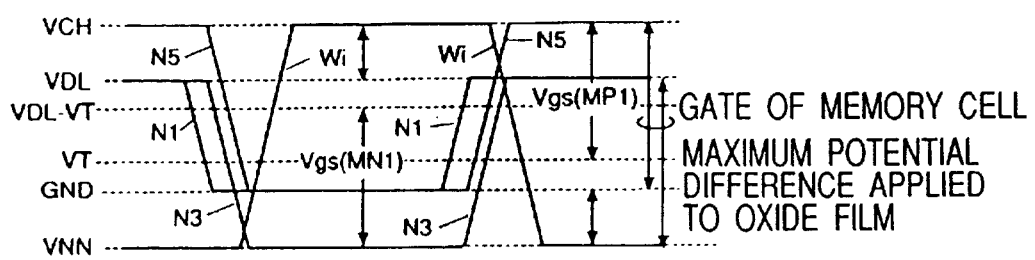
FIG. 7 is a waveform diagram illustrating operations of the word driver of FIG. 6.

As a result, as shown in the operational waveform diagram of FIG. 7, even when the output terminal is at the negative voltage VNN corresponding to the nonselect level of the word line Wi because of the on state of the n-channel type output MOSFET MN1, only a voltage VCH−(VSS+VT) is applied between the gate and drain of the p-channel type output MOSFET MP1 in the off state.

The level conversion circuit LSN generates a driving signal N3 having a signal amplitude like the voltages VDL and VNN as described above to control the on and off states of the output MOSFET MN1. The n-channel MOSFET MN1 maintains the drain voltage of the output MOSFET MN1 at the internal low voltage VDL−VT (VT represents the threshold voltage of the MOSFET MN2) even when the word line Wi is at the high voltage VCH. As a result, as shown in the operational waveform diagram of FIG. 7, even when the output terminal is at the internal high voltage VCH corresponding to the select level of the word line Wi, because of the on state of the p-channel type output MOSFET MP1, only a voltage (VDL−VT)−VNN is applied between the gate and drain of the n-channel type output MOSFET MN1 in the off state.

That is, as shown in the operational waveform diagram of FIG. 7, there is a synergistic action between the action of the above-described two types of level conversion circuits LSP and LSN so as to limit signal amplitudes such as the driving voltages N5 and N3 and the action of the MOSFETs MP2 and MN2 provided in series to divide the applied voltage, and this makes it possible to limit the voltages applied to the output MOSFETs MP1 and MN1 to small values regardless of the fact that the select and non-select levels of the word line Wi are high voltages corresponding to the inteynal high voltage VCH and internal negative voltage VNN as described above. Referring to the memory cell, since the storage capacitor Cs maintains the circuit ground potential VSS or internal low voltage VDL, a maximum voltage like VNN–VDL is applied when the word line Wi is at the negative voltage VNN as in the non-select state and a maximum voltage like VSS–VCH is applied immediately after the word line Wi is set at the select voltage VCH.

The level converting operation of the level conversion circuit LSP can be summarized as follows. When the output signal N1 of the gate circuit G1 that constitutes the X-decoder XDEC is at a low level corresponding to the ground potential VSS, the p-channel MOSFET Q19 of one CMOS inverter circuit (Q17 and Q19) is turned on. Referring to the other CMOS inverter circuit (Q16 and Q18), the n-channel MOSFET Q16 is turned on by the high level of the output signal of the inverter circuit IV1 to set the output signal at the low level. As a result, the p-channel type MOSFET Q21 is turned on, and the output signal N4 is set at a high level like the high voltage VCH through the MOSFET Q19 in the on state. Consequently, the p-channel type MOSFET Q20 is turned off while generating a high level corresponding to the high voltage VCH to prevent any direct current from flowing to the other CMOS inverter circuit.

When the output signal N1 of the gate circuit G1 that constitutes the X-decoder XDEC is at a high level like the internal low voltage VDL, the n-channel MOSFET Q17 of one CMOS inverter circuit (Q17 and Q19) is turned on. Referring to the other CMOS inverter circuit (Q16 and Q18), the output signal of the inverter circuit IV1 becomes a low level to turn the p-channel MOSFET Q18 on. Since the output signal N4 is set at a low level by the on state of the MOSFET Q17 so as to turn the p-channel type MOSFET Q20 on, the output signal of the other CMOS inverter circuit is set at a high level corresponding to the high voltage VCH. As a result, the p-channel type MOSFET Q21 is turned off to prevent any direct current from flowing to the other CMOS inverter circuit that generates the output signal N4 at the low level.

The level converting operation of the level conversion circuit LSN is substantially the same as described above, and the following is a description of only the operation thereof that takes place when the output signal N1 of the gate circuit G1 constituting the X-decoder XDEC is at a low level corresponding to the ground potential VSS. The p-channel type MOSFET of one CMOS inverter circuit to which the output signal N1 is supplied is turned on. Since a signal at a high level which is the inversion of the same is applied to the other CMOS inverter circuit, the n-channel MOSFET is turned on. The on state of the p-channel MOSFET of the first CMOS inverter circuit sets the output signal N2 at a high level like the internal low voltage VDL and turns the n-channel MOSFET of the other CMOS inverter circuit on. As a result, the two n-channel type MOSFETs are turned on, and the output signal of the other CMOS inverter circuit will be at the negative voltage VNN. Consequently, a high level output signal N2 corresponding to the internal low voltage VDL is generated while turning off the associated n-channel type MOSFET at the negative voltage VNN to prevent any direct current from flowing to the first CMOS inverter circuit.

Figure 8:
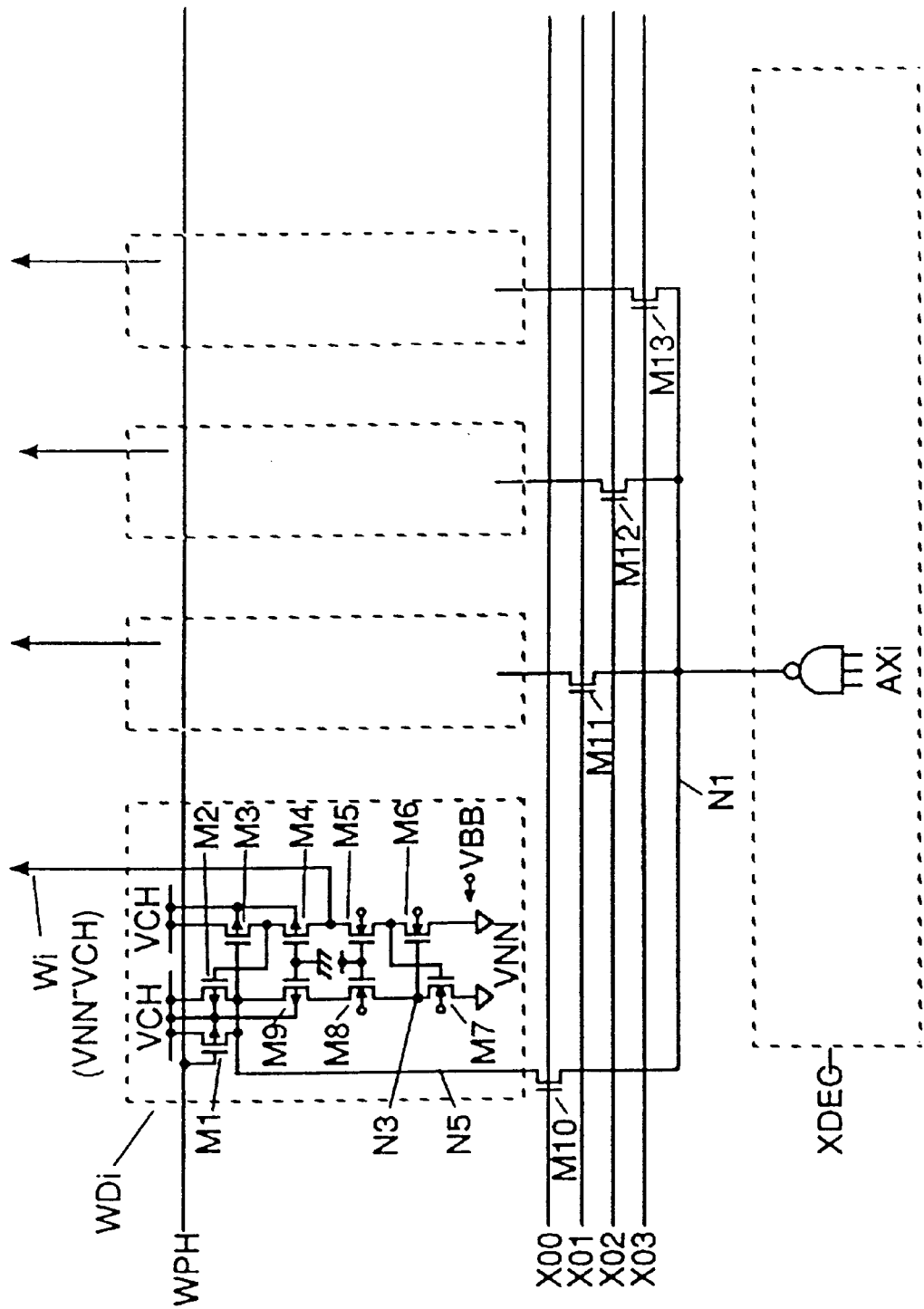
FIG. 8 is a circuit diagram of another embodiment of a word driver WD of a dynamic RAM according to the invention.

FIG. 8 shows a circuit diagram of another embodiment of the word drivers WD. In the present embodiment, the X-decoder is divided into two circuits. A first decoder XDEC generates selection signals N1 for four word lines. The selection signals are supplied to respective word drivers WDi through switch MOSFETs M10 through M13 which are switched under the control of selection signals X00, X01, X10 and X11 generated by a second decoder (not shown).

As apparent from the illustrated circuit as an example, the word drivers WDi have both a level converting function and a word drive function. P-channel type output MOSFETs M3 and M4 and n-channel type MOSFETs M6 and M5 form a word driver as described above. The n-channel type output MOSFET M6 is latched with the n-channel MOSFET M7 to provide the level converting function as described above. The MOSFET M7 is connected in series to an n-channel MOSFET M8 for improving the withstand voltage and is supplied with the internal low voltage VDL at the gate thereof similar to the MOSFET M5.

The p-channel type MOSFET M3 is provided with a p-channel type MOSFET M2 latched for level conversion. The gate of the output MOSFET M3 is precharged at the high voltage VCH through a p-channel type MOSFET M1 which is controlled by a precharge signal WPH. The selection signal N5 is supplied to this input point through the switch MOSFET M10.

Figure 9:
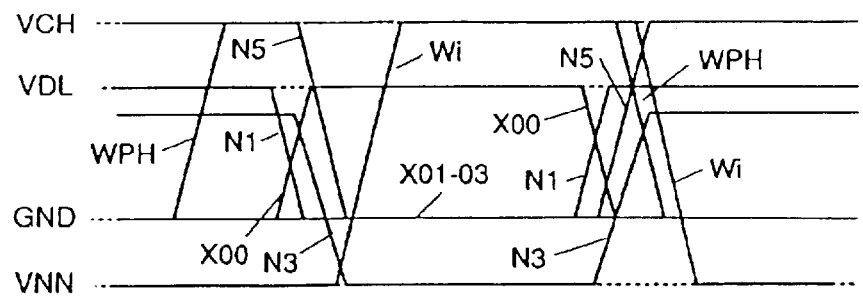
FIG. 9 is a waveform diagram illustrating operations of the word driver of FIG. 8.

FIG. 9 shows a timing chart illustrating operations of the word driver. When the precharge signal WPH is at a low level like a ground potential GND of the circuit, the p-channel type MOSFET M1 is turned on to precharge the input terminal at the high voltage VCH. The precharge operation turns the MOSFET M3 off and, at the same time, a gate potential N3 of the n-channel output MOSFET M6 is set at a high level like VDL–VT through the MOSFETs M9 and M8 in the on state. Therefore, the MOSFET M6 is turned on to set the word line Wi at a non-select level like the negative voltage VNN.

With the MOSFET M6 in the on state, the negative voltage VNN is supplied to the gate of the MOSFET M7 latched with the same to turn it off. This makes it possible to prevent any short circuit current from flowing through a series path formed by the precharge MOSFET M1 in the on state, the MOSFETs M9 and M8 which are steadily kept on for an improved withstand voltage as described above and the MOSFET M7.

The operation of the X-decoder sets the output signal N1 of the first decoder XDEC 1 at a low level. When the MOSFET M10 is turned on by the high level of the selection signal X00 among the four word lines, the selection signal N5 at the input terminal is pulled to a low level. As a result, the output MOSFET M3 is changed from the off state to the on state to cause the word line Wi to rise from the negative voltage VNN to the high voltage VCH. The rise of the voltage turns the MOSFET M7 on to decrease the gate voltage N3 of the MOSFET M6 from the voltage VDL–VT to the negative voltage VNN. This turns the MOSFET M6 off and causes the potential at the word line Wi to be increased to the high voltage VCH at a high speed. Referring to other unselected word lines, since the precharge voltage is maintained by the word drivers associated therewith, the p-channel type output MOSFET is turned off and the n-channel type MOSFET is turned on to maintain a non-select level like the negative voltage VNN.

The termination of the operation to select the word line Wi sets the decode signal X00 at the low level and turns the MOSFET M10 off. The output signal N1 of the first decoder XDEC 1 returns to the high level. Thereafter, the precharge signal WPH changes to the low level to turn the MOSFET M1 on. The voltage N5 at the input terminal is therefore precharged at the high voltage VCH. This precharge operation turns the p-channel type output MOSFET M3 off, and the gate voltage N3 of the n-channel type MOSFET M6 is set at a limited high level like VDL–VT by the MOSFET M8. The on state of the MOSFET M6 causes the select-level (VCH) of the word line Wi to fall to the negative voltage VNN corresponding to the non-select level. This configuration also makes it possible to maintain the high reliability of the device because the voltages applied to the output MOSFETs M3 and M6 are limited as described above.

According to the present embodiment, word drivers associated with four word lines share the first X-decoder circuit XDEC as described above. This makes it possible to reduce the number of MOSFETs required per word line. In other words, it is possible to match the pitch of word lines provided in a high density with the pitch of X-decoders generating selection signals therefor, thereby allowing a high level of integration.

Figure 10:
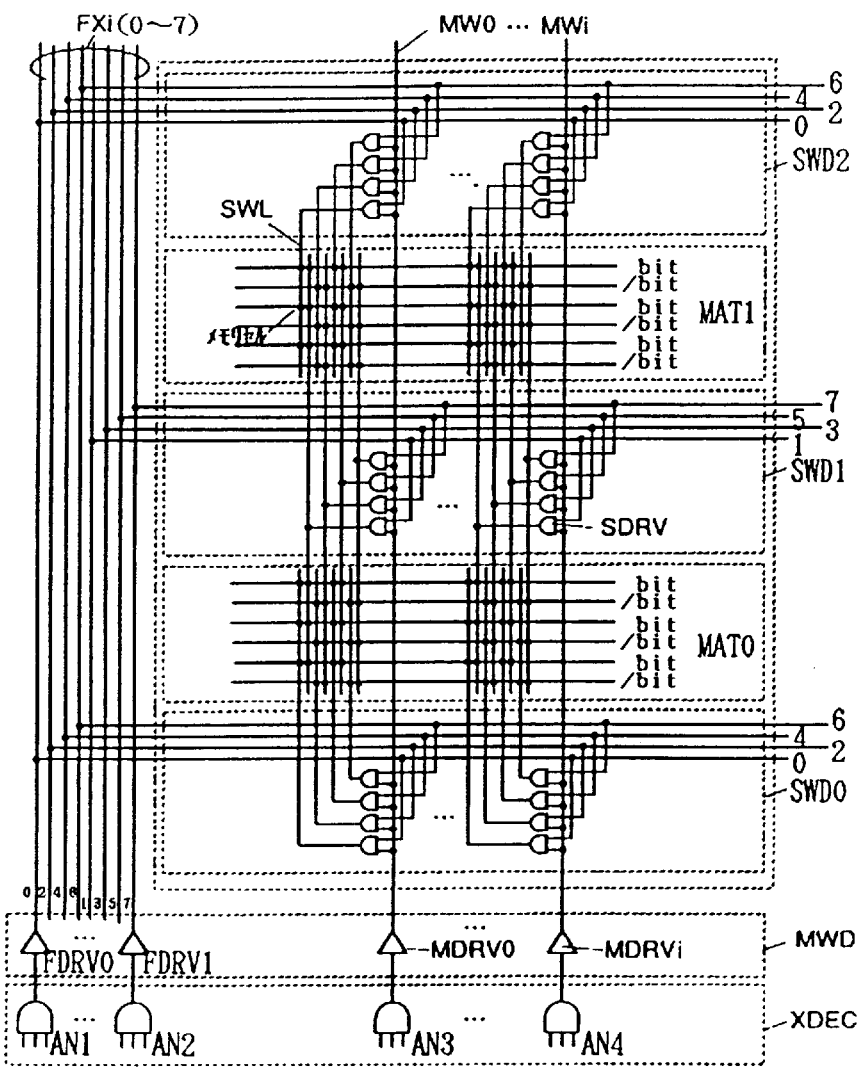
FIG. 10 is a diagram of an embodiment of the invention which represents an application of the same to a hierarchical word driver.

FIG. 10 shows a configuration diagram of an embodiment which is an application of the invention to a hierarchical (split word line type) word driver. A hierarchical word line is a word line split into a main word line and a sub word line to which a memory cell is connected. The purpose of a hierarchical word system as described above is to relax the pitch of patterns on a metal wiring layer of a so-called word shunt system in which word lines having high resistance are backed by a metal wiring layer having lower resistance. Such split word lines make it possible to achieve a higher level of integration with an increased storage capacity.

FIG. 10 shows a schematic configuration to illustrate the relationship between main word lines and sub word lines on the memory mats. FIG. 10 shows two exemplary main word lines MWO and Mwi. The main word lines MW0, Mwi and the like are selected or unselected by drivers MDRV0, MDRVi and the like provided at the main word driver MWD. A plurality of sets of sub word lines SWL are provided for one main word line MW0 in the direction in which it extends. FIG. 10 shows three sets of exemplary sub word lines SWL among them. Eight sub word lines SWL in total, i.e., those with even-numbers 0 to 6 and those with odd numbers 1 to 7 are alternately provided on memory mats MAT0 and MAT1. The pitch of the main word lines can be relaxed by a factor of 1/8 by allocating eight sub word lines for one main word line in the direction in which it is arranged.

Except for the sub word lines with even numbers 0 to 6 adjacent to the main word driver MWD and the sub word lines 1 to 7 provided at the further end of the main word line MW0 (opposite to the word driver) which is not shown, sub word drivers SWD1 and the like provided between the memory mats generate selection signals for a pair of sub word lines on the memory mats MAT0, MAT1 an the like on the left and right of the same. By dividing the length of the sub word lines in the extending direction of the main word lines in such a manner, the number of memory cells connected to one sub word line can be decreased to increase the speed of the memory cell selecting operation.

With the above-described configuration in which the sub word lines are separated into those with the even numbers 0 to 6 and those with the odd numbers 1 to 7 and in which the sub word drivers SWD0, SWD1 and the like are provided on both sides of the memory mats, the substantial pitch of the sub word lines SWL provided in a high density in accordance with the arrangement of the memory cells can be doubled in the sub word drivers SWD0 and SWD1, which makes it possible to efficiently lay out drivers SDRV provided in the sub word drivers SWD0 and SWD1 and the sub word lines SWL and the like associated therewith. The drivers SDRV select or do not select the sub word lines SWL depending on the logical AND relationship between the main word lines MWi and sub word selection lines FXi.

Selection signals generated by gate circuits AN3, AN4 and the like that constitute the X-decoder XDEC are supplied to the main word driver MWD. The main word driver MWD is constituted by drivers MDRV0, MDRVi and the like, which receive the selection signals and drive the main word lines MW0, MWi and the like as selection signals associated with the four sub word lines 0 to 6 (and 1 to 7) of the respective memory mats MAT0 and MAT1 to select them or not. The sub word selection lines FXi are provided to select one sub word line from among the four sub word lines 0 to 6 or 1 to 7. There is provided eight sub word selection lines FXi, such as FX0 to FX7, and the selection signals are generated by the gate circuits AN1, AN2 and the like included in the X-decoder XDEC.

Sub word selection lines with even numbers FX0 to FX6 are supplied to the sub word drivers in even numbered rows SDRV0 to SDRV6 through the driver FDRV0 and the like included in the main word driver MWD, and sub word selection lines with odd numbers FX1 to FX7 are supplied to the sub word drivers in odd-numbered rows FDRV1 to FDRV7 through the driver FDRV1 and the like. The sub word selection lines FX0 to FX7 are formed by a metal wiring layer M2 which is the second layer at the periphery of the array similar to the main word line MW0 and the like, although the invention is not limited thereto. The sub word selection lines FX0 to FX7 are branched in regions corresponding to the sub word drivers and are similarly, constituted by a metal wiring layer M3 which is the third layer in regions where they cross the main word lines MW0 to MWi constituted by the second layer, i.e., the metal wiring layer M2. They extend in a direction perpendicular to the main word lines to be guided to the input of the sub word drivers.

Figure 11:
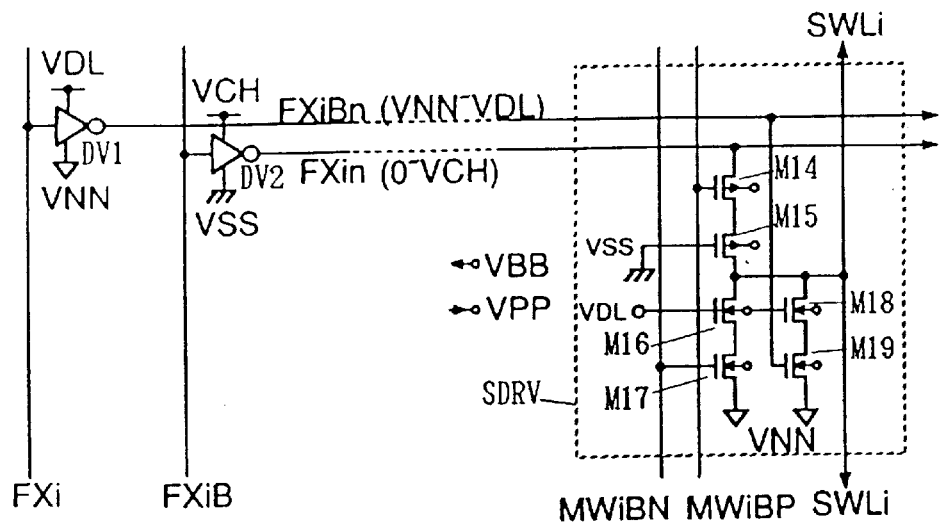
FIG. 11 is a circuit diagram of an embodiment of a sub word driver SDRV adapted to the hierarchical word driver system of FIG. 10.

FIG. 11 shows a circuit diagram of an embodiment of a sub word driver SDRV adapted to the abovedescribed hierarchical word driver system. In this embodiment, in order to maintain high reliability as described above, a sub word selection line and main word line as described above are constituted by a pair of signal lines. Specifically, signals FXiB and FXi on a pair of sub word selection lines are substantially regarded as complementary signals in that the signal FXin is at a low level like the negative voltage VNN when the signal FXiB is at a high level like the internal high voltage VCH and in that the signal FXin is az a high level like the internal low voltage VDL when the signal FXiB is at a low level like the circuit ground potential VSS.

The signals FXi and FXiB on the sub word selection line are respectively inverted by drivers DV1 and DV2 at a branching portion where the sub word drivers are provided to generate signals FXiBn and FXin for sub word selection lines associated with the sub word drivers. The signal FXin on the branched sub word selection line is used as the operating voltage of the sub word driver SDRV to be described later. Specifically, a selected sub word line is set at the above-described internal high voltage VCH, and an unselected sub word line is set at the ground potential VSS (0 V) of the circuit. The signal FXiBn on the branched sub word selection lines is used for setting a sub word line SWL at the negative voltage VNN when the signal FXin is at the ground potential of 0 V that represents the unselected state.

Select and non-select signals having substantially the same phase are supplied to the pair of main word lines MWiBP and MWiBN such that the main word line MWiBN is at a high level like the internal low voltage VDL when the main word line MWiBP is at a high level like the internal high voltage VCH and such that the main word line MWiBN is at a low level like the internal negative voltage VNN when the main word line MWiBP is at a low level like the ground potential Vss.

The two signals MWiBP and MWiBN drive p-channel type output MOSFET 14 and an n-channel type output MOSFET M17, similar to those shown in FIG. 6, to set a sub word line SWL at the select or non-select levels, i.e., VCH or VNN. The only difference which exists from the circuit shown in FIG. 6 is that the operating voltage is supplied through the sub word selection line FXin as described above. Therefore, MOSFETs M18 and M19 are provided to set a sub word selection line SWL at the negative voltage VNN representing the unselected state when the sub word selection line FXin is at a non-select level like 0 V and the signals MWiBP and MWiBN of the main word line are at the select level, and the internal low voltage VDL in the sub word selection line FxiBN is supplied to the gate of such a MOSFET M19. As a result, the MOSFET M19 is turned on to set the sub word line SWL at a non-select level like the negative voltage VNN when the sub word selection line FXin is at a non-select like such as 0 V and the signals MWiBP and MWiNP on the main word line are at a select level.

The MOSFETs M15, M16 and M18 share the voltage applied to the gate insulation films of the output MOSFETs M14, M17 and M19 to reduce the same as described above, and a synergetic effect between reductions of the amplitudes of the signals, such as reductions from VNN to VDL and from VSS to VCH, makes it possible to maintain the high reliability of the device.

Figure 12:
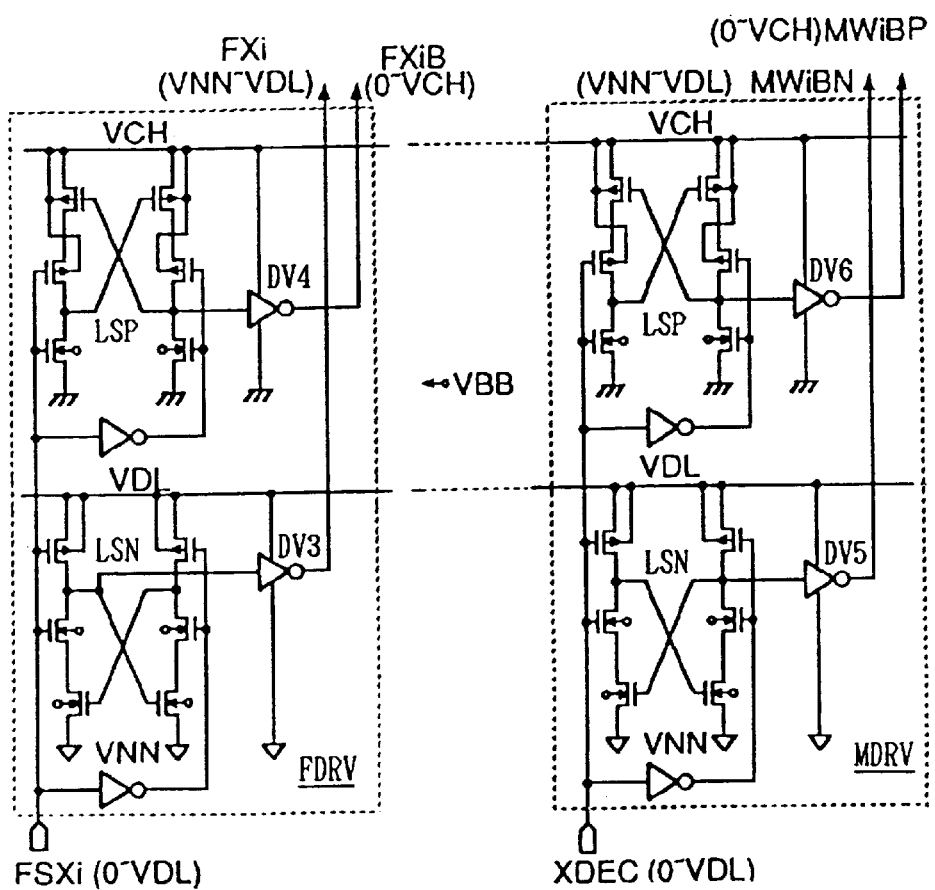
FIG. 12 is a circuit diagram of an embodiment of drivers for driving the sub word selection lines and main word lines in FIG. 11.

FIG. 12 is a circuit diagram of an embodiment of driver for driving the sub word selection lines and main word lines. As shown in the waveform diagram shown in FIG. 13, a driver FDRV receives a sub word selection line FSXi having a small amplitude between 0 and VDL generated by the X-decoder XDEC and generates the signals FXi and FXiB supplied to the sub word selection line. Specifically, the signal FSXi having a small amplitude is subjected to level conversion at level conversion circuits LSN and LSP similar to those described with reference to FIG. 6 to be converted respectively into signal amplitudes between VNN and VDL and between 0 and VCH which are output to the sub word selection lines FXi and FXiB through drivers DV3 and DV4 provided at the output portion.

Figure 13:
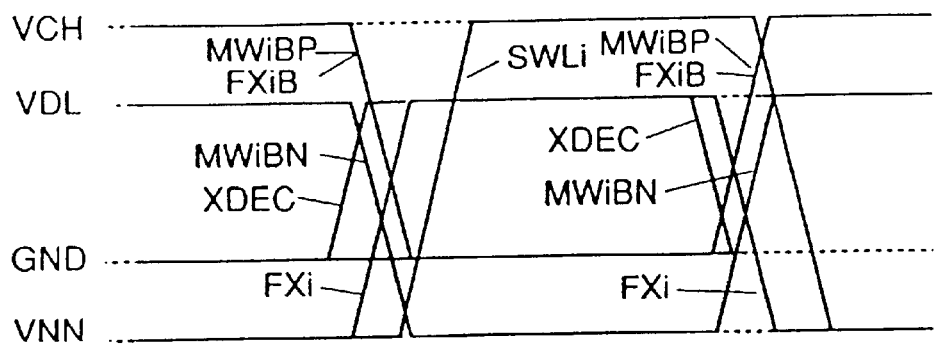
FIG. 13 is a waveform diagram illustrating operations of the circuit of FIG. 12.

As shown in the waveform diagram of FIG. 13, a main word driver MDRV receives a main word line selection signal having a small amplitude, e.g., between 0 and VDL generated by the X-decoder and generates select And non-select signals supplied to the main word lines MWiBN and MWiBP. Specifically, a small amplitude signal XDEC is subjected to level conversion at level conversion circuits LSN and LSP similae to those described with reference to FIG. 6 to be converted respectively into signal amplitudes between VNN and VDL and between 0 and VCH which drive the main word lines MWiBN and MWiBP through drivers DV5 and DV6 provided at the output portion.

In such a hierarchical word system, the output MOSFET that constitutes each driver as described above is provided with MOSFETs for voltage sharing as described above, and the signal amplitude thereof is shared by a p-channel type MOSFET and an n-channel type MOSFET to transmit two types of relatively small signal amplitudes, which makes it possible to maintain the high reliability of the device.

Figure 14:
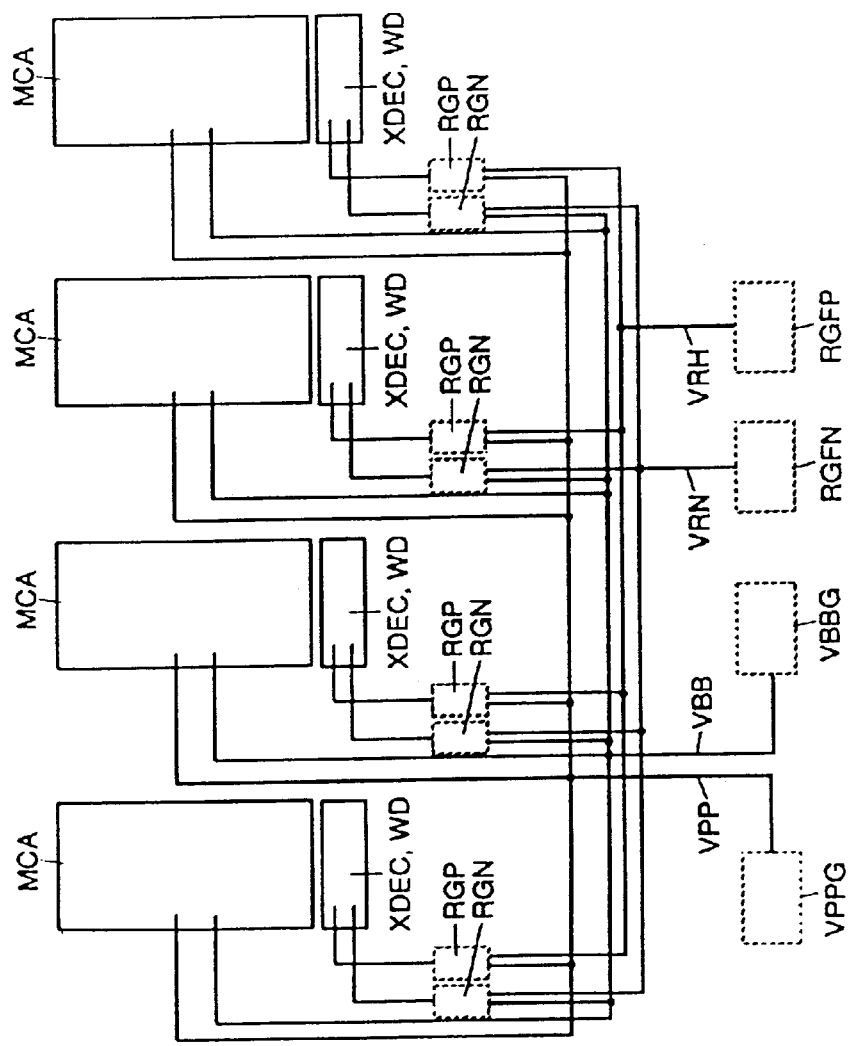
FIG. 14 is a schematic circuit diagram of another embodiment of a power supply circuit of a dynamic RAM according to the invention.

FIG. 14 is a schematic block diagram of another embodiment of a power supply circuit of a dynamic RAM according to the invention. The dynamic RAM of the present embodiment has a plurality of (four in FIG. 14) memory arrays MCA. When the above-described hierarchical word driver system is employed, each of those memory arrays MCA is formed by a plurality of memory mats to be described later. In the present embodiment, a plurality of constant voltage circuits RGN and RGP are provided for a charge pump circuit VPPG for a high voltage and a charge pump circuit VBBG for a negative voltage. A plurality of constant voltage circuits RGN and RGP are provided in a one-to-one relationship with the plurality of memory arrays MCA, although this is not a requirement of the invention. Since the voltages VCH and VNN are the same for the memory arrays MCA, common reference voltage generation circuits RGFP and RGFN are used to generate reference voltages VRH and VRN associated with the voltages VCH and VNN.

In this configuration, the constant voltage circuits RGP and RGN can be provided as a load in the vicinity of the word line selection circuits XDEC and word drivers WD of the memory arrays MCA. This makes it possible to decrease the length of wiring, to reduce the power supply impedance and to reduce the scale of the circuit because the charge pump circuits VPPG and VBBG and the reference voltage generation circuits RGKP and RGFN can be used on a shared basis. The voltages generated by the charge pump circuits VPPG and VBBG have a great absolute value such that a voltage change does not cause any problem even if it occurs during transition to the word line select state or word line non-select state. The reference voltage generation circuits are used only to provide reference voltages for the differential circuits, and substantially no current flows through them. Therefore, substantially no problem occurs even if they are shared by a plurality of circuits through long wiring.

Figure 15:
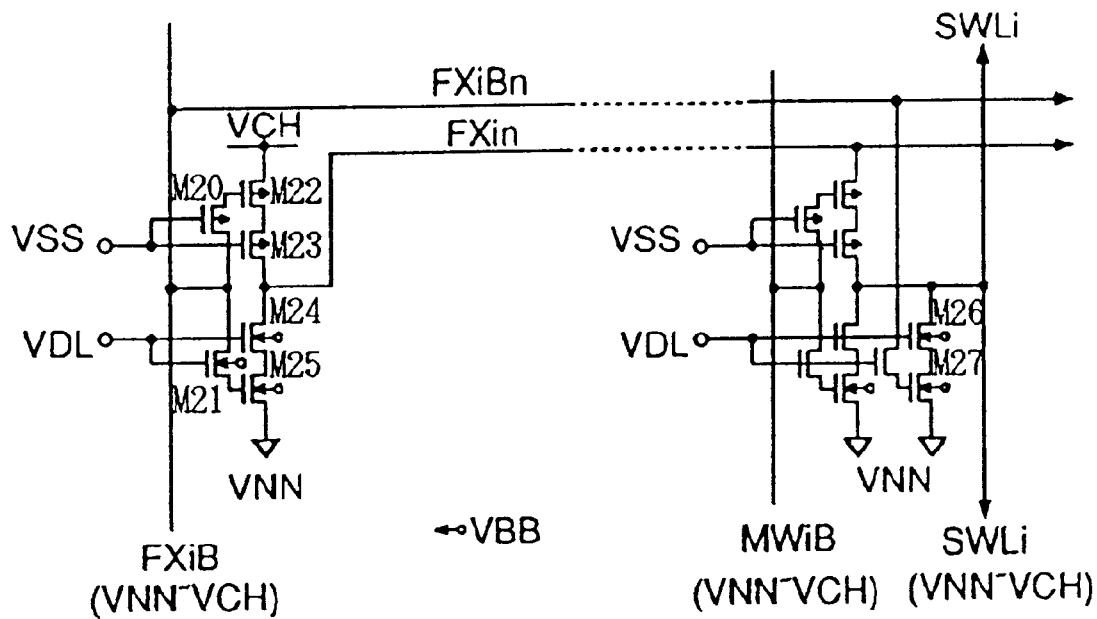
FIG. 15 is a circuit diagram of another embodiment of a sub word selection line driver and a sub word driver adapted to a hierarchical word driver system.

FIG. 15 shows a circuit diagram of another embodiment of a driver for selecting a sub word line and a sub word driver adapted to the above-described hierarchical word driver system. The present embodiment is designed such that the sub word line can be selected with one main word line MWiB and one sub word selection line FXiB. Such a configuration with one sub word selection line and one main word line makes it possible to reduce the number of wirings and the number of circuit elements.

Figure 16:
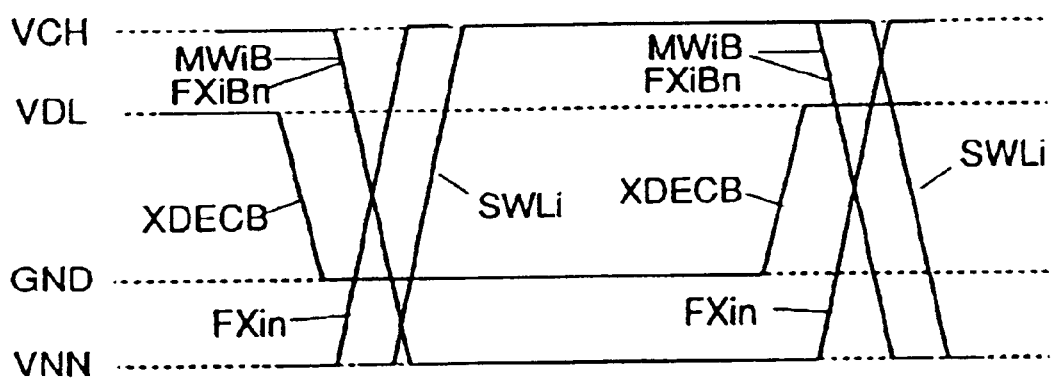
FIG. 16 is a waveform diagram illustrating operations of the circuit of FIG. 15.

To accommodate a configuration with one sub word line and one main word line as described above, the select and non-select signal levels are represented by great signal amplitudes, e.g., between VNN and VCH as shown in the waveform diagram of FIG. 16. A driver for generating an inversion signal is provided at a branching portion of the sub word selection line as described above. The driver is operated by the voltages VCH and VNN to generate the sub word selection line FXin which is the inversion of the signal FXiBn and which is used as an operating voltage of the sub word driver as shown in the waveform diagram of FIG. 16.

At the driver at the branching portion, the signal on the sub word selection line FXiB is transmitted to the gate of an n-channel type output MOSFET M25 for outputting the negative voltage VNN through an n-channel type MOSFET M21 which is supplied with the voltage VDL at the gate thereof and to the gate of a p-channel type MOSFET M22 for outputting the high voltage VCH through the p-channel type MOSFET M20 which is supplied with the ground potential VSS at the gate thereof. A p-channel type output MOSFET M24 to which the ground potential VSS is applied at the gate thereof is inserted in series between the p-channel type output MOSFET M22 and an output terminal, and an n-channel type MOSFET M24 to which the voltage VDL is applied at the gate thereof is provided between the n-channel type output MOSFET M25 and an output terminal.

As described above, while the sub word selection line FXiB has a large signal amplitude, e.g., between the voltages VCH and VNN, only a relatively low voltage is applied to each of the output MOSFETs M22 and M25 that form a driver similar to that shown in FIG. 7, which makes it possible to maintain the high reliability of the device.

The sub word driver is similar to the above-described driver. However, in order to set a sub word line SWLi at a non-select level like the negative voltage VNN when the main word line MWiB is at a select level like the voltage VNN and the sub word selection line FXin is at a non-select level like the voltage VNN, there is provided a MOSFET M27 whose gate is connected to the sub word selection line FXiBn and whose high level (VCH) is transmitted to the gate through a MOSFET for voltage division to which the voltage VDL is applied at the gate thereof as described above to establish an on state, and this sets the sub word line SWLi at the negative voltage VNN. In this case, a MOSFET M26 for voltage division to which the voltage VDL is applied at the gate thereof is also connected in series between the MOSFET and the output terminal to which the sub word line SWLi is connected.

Since the driver for driving the sub word selection line FXiB and main word line MWiB generates an output signal VNN–VCH, a word driver as shown in FIG. 6 is used.

Figure 17:
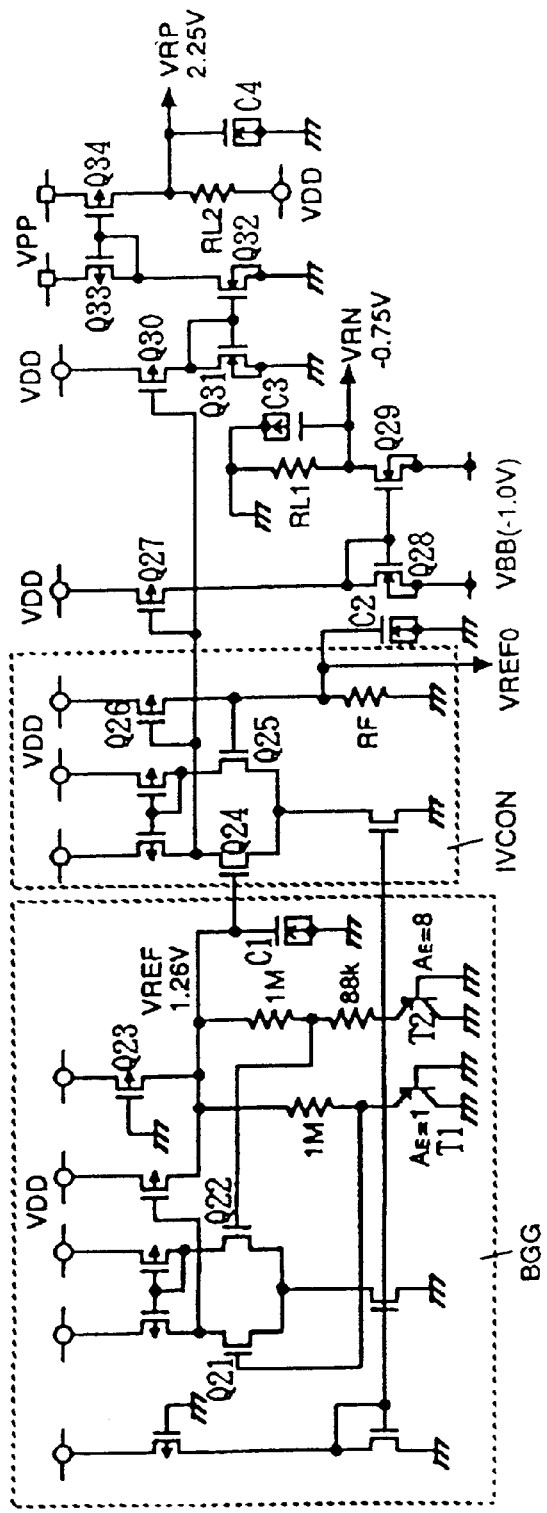
FIG. 17 is a circuit diagram of an embodiment of a reference voltage generation circuit.

FIG. 17 shows a circuit diagram of an embodiment of a reference voltage generation circuit. The circuit of this embodiment generates reference voltages VRN and VRP associated with the voltages VCH and VNN. The reference voltage generation circuit is constituted by a reference voltage circuit BGG utilizing a silicon bandgap of a bipolar transistor, a voltage-to-current conversion circuit IVCON for converting a voltage generated by the reference voltage circuit into a current signal and a circuit for generating the reference voltages VRN and VRP from such a current signal utilizing a current mirror circuit.

Bipolar transistors T1 and T2, which are formed to have different emitter areas $A_E$, i.e., 1 and 8 respectively, are commonly connected at their collectors and bases to provide a diode configuration and are applied with the same current at their emitters through a high resistance such as 1 MΩ. A differential voltage in accordance with the silicon bandgap is thus generated and is applied to a resistor of 88 kΩ or the like to generate a constant current. Specifically, the voltage supplied to the high resistance is controlled by a differential amplifier circuit formed by the differential MOSFETs Q21 and Q22 such that the emitter voltage of the transistor T1 equals the emitter voltage of the transistor T2 developed through the resistance of 88 KΩ. As a result, the high resistance generates a reference voltage VREF of, e.g., 1.26 V.

The transistors T1 and T2 use the source and drain diffusion regions of the p-channel type MOSFET as the emitters thereof, the n-well type region NWELL where they are formed as the bases thereof and the p-type substrate as the collectors thereof. The collectors and bases are commonly connected and are set at the ground potential applied to the p-type substrate. Any differential voltage generated at the resistance of 88 kΩ is set at a voltage such as 1.26 V as described-above in accordance with the ratio of resistance of the same to the higher resistance through which the same current flows.

An activation circuit is constituted by a p-channel type MOSFET M23 to which the ground potential is supplied at the gate thereof to cause it to function as a resistive element. In order to keep the reference voltage circuit BGG formed by the transistors T1 and T2 and the differential amplifier circuit stable even if the reference voltage VREF is 0 V, i.e., the transistors T1 and T2 are off and the differential MOSFET Q21 and Q22 are off, the activation circuit is provided to generate a reference voltage of, e.g., 1.26 V as described above. The reference voltage VREF is made more stable by providing a capacitor C1.

A voltage-to-current conversion circuit IVCON is a voltage follower circuit formed by a differential circuit comprising differential MOSFETs Q24 and Q25 and an output MOSFET Q26 in which the reference voltage VREF flows through a resistor RF to generate a constant current. Since this constant current flows through the output MOSFET Q26, p-channel type MOSFETs Q27 and Q30 which share a gate and a source with the same are provided to form a current mirror circuit, and a reference current as a result of current conversion is extracted from the drains of the MOSFETs Q27 and Q30. A reference voltage VREFO generated by the resistor RF is used by a level sensor to be described later, although this is not a requirement of the invention.

The reference current output from the drain of the MOSFET Q27 is supplied to a current mirror circuit formed by n-channel MOSFETs Q28 and Q29 whose sources are connected to a substrate reference voltage VBB, e.g., –1.0 V generated by the charge pump circuit VBBG, and a current output from the same is passed through a resistor RL1 provided between itself and the ground potential to generate the reference voltage VRN which is at, for example, –0.75 V. A capacitor C3 is provided in parallel with the resistor RL1 to provide a stable voltage.

The reference current output from the drain of the MOSFET Q30 is supplied to a current mirror circuit formed by n-channel MOSFETs Q31 and Q32 whose sources are connected to the ground potential of the circuit, and a reference current obtained through such a current mirror circuit is supplied to p-channel type MOSFETs Q33 and Q34 whose sources are connected to a high voltage VPP generated by the charge pump circuit VPPG. A resistor RL2 is provided between the output of the same and the internal voltage VDD (VDL) to generate the reference voltage VRP which is at, for example, about 2.25 V using the voltage VDD as a reference. A capacitor C4 is provided to stabilize the reference voltage VRP.

When the p-channel type MOSFETs and n-channel type MOSFETs forming the current mirror circuits have the same device size so as to generate currents equivalent to the reference voltage generated by the resistor RF, the reference voltages VRP and VRN are expressed by the following equations 1 and 2.

$$VRP = VREF \times RL2/RF + VDD \ (VDL) \quad \text{Equation 1}$$

$$VRN = VREF \times RL1/RF \quad \text{Equation 2}$$

Thus, the circuit of the above embodiment generates the reference voltage VREF utilizing a silicon bandgap, and the reference voltages VRP and VRN are generated based on the resistance ratios RL2/RF and RL1/RF. It is therefore possible to generate the reference voltages VRP and VRN with high accuracy because the resistance ratios are not adversely affected even if circuit elements formed on semiconductor circuits having significant process-related variations are used.

Figure 18:
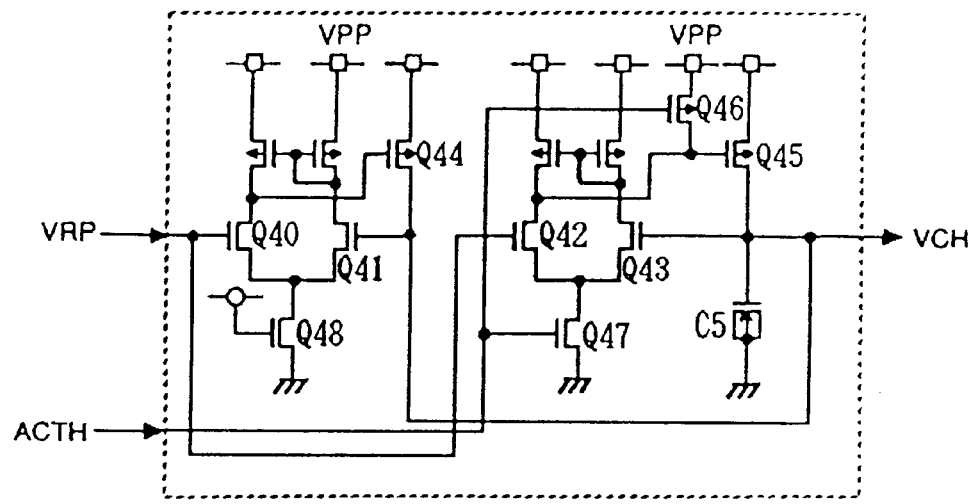
FIG. 18 is a circuit diagram of an embodiment of the constant voltage generation circuit RGP in FIG. 2.

FIG. 18, is a circuit diagram of an embodiment of the constant voltage generation circuit RGP. In this embodiment, the differential amplifier circuit is constituted by two circuits. A circuit formed by differential MOSFETs Q40 and Q41 and a MOSFET Q44 acting as a variable resistive element is operated steadily by steadily applying a constant voltage like the voltage VDL to the gate of a MOSFET Q48 for generating an operating current. That is, only a small current is applied to the MOSFET Q48 in order to reduce the current consumed by the constant voltage generation circuit itself when the memory circuit is in a standby state.

In order to provide a capability of supplying a relatively great current in order to accommodate switching of word line selection and non-selection operations during memory access, an n-channel type MOSFET Q47 is turned on by a control signal ACTH to operate a constant voltage circuit formed by differential MOSFETs Q42 and Q43 and a MOSFET Q45 acting as a variable resistance element during memory access. In this circuit, when the signal ACTH is in a non-operating state at a low level, a p-channel type MOSFET Q46 is turned on to turn off the MOSFET Q45 acting as a variable resistance element.

Figure 19:
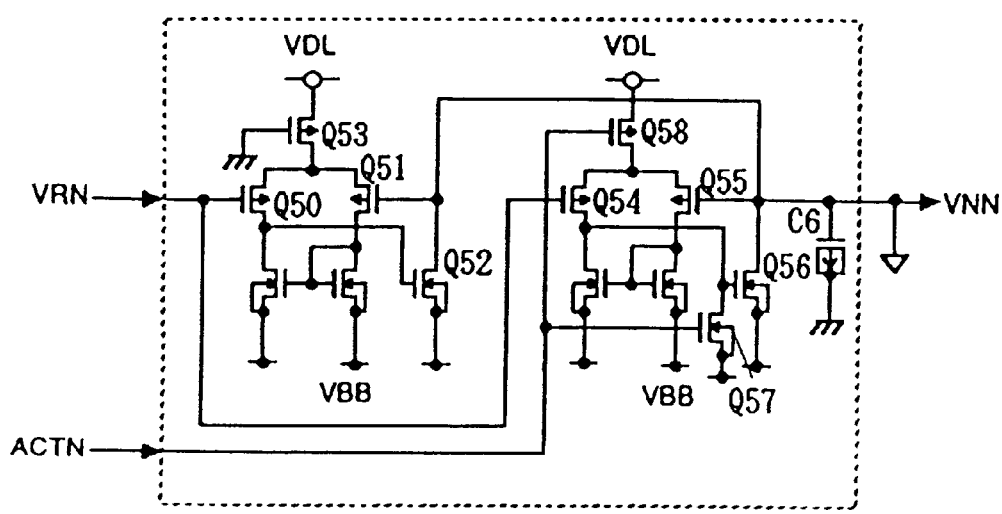
FIG. 19 is a circuit diagram of an embodiment of the constant voltage generation circuit RGN in FIG. 2.

FIG. 19 is a circuit diagram of an embodiment of the constant voltage generation circuit RGN. In this embodiment, the differential amplifier circuit is constituted by two circuits. A circuit formed by differential MOSFETs Q50 and Q51 and a MOSFET Q52 acting as a variable resistance element is operated steadily by steadily applying a ground potential such as VSS to the gate of a MOSFET Q43 for generating an operating current. That is, only a small current is applied to the MOSFET Q53 in order to reduce the current consumed by the constant voltage generation circuit itself when the memory circuit is in a standby state.

In order to provide a capability of supplying a relatively great current in order to accommodate switching of word line selection and non-selection operations during memory access, a p-channel type MOSFET Q58 is turned on by a control signal ACTH at a low level to operate a constant voltage circuit formed by differential MOSFETs Q54 and Q44 and the MOSFET Q56 acting as a variable resistance element during memory access. In this circuit, when the signal ACTH is in a non-operating state at a high level, an n-channel type MOSFET Q57 is turned on to turn off the MOSFET Q56 acting as a variable resistance element.

Figure 20:
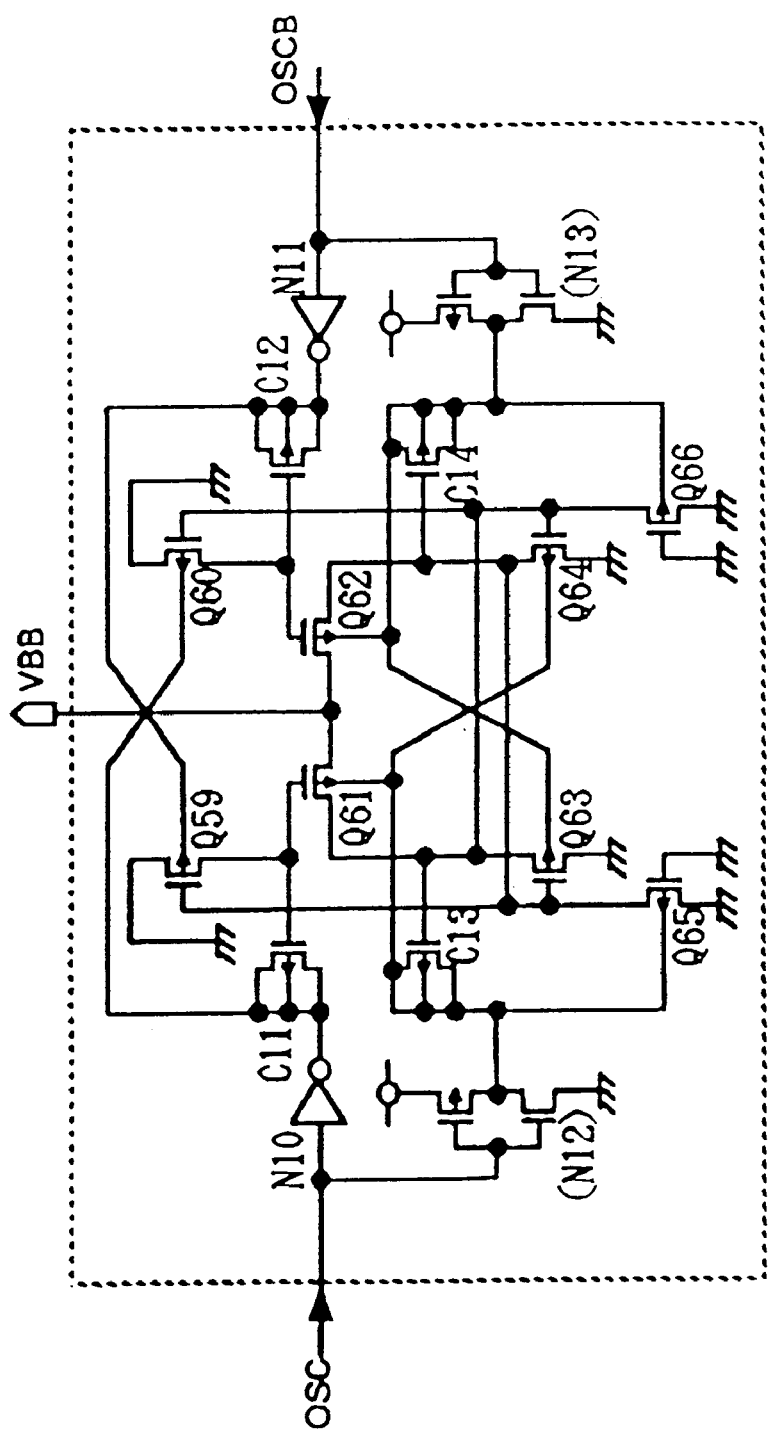
FIG. 20 is a circuit diagram of an embodiment of the charge pump circuit 7 for VBB in FIG. 2.

FIG. 20 shows a circuit diagram of an embodiment of the charge pump circuit 7 for VBB. The embodiment is configured using p-channel type MOSFETs Q59 through Q66, although this is not a requirement of the invention. The p-channel type MOSFETs are formed in an n-type well region. Therefore, they can be electrically isolated from the p-type well region where memory cells are formed, and a charge pump operation generates minority carriers in the n-type well region. Thus, there is no influence on the memory cells formed in the p-type well region at all.

A basic circuit of a pumping circuit for generating the negative voltage VBB is constituted by a capacitor C13 formed using a MOS capacitance and MOSFETS. Q61 and Q63. A similar basic circuit is formed by a capacitor C14 and MOSFETs Q62 and Q64, and pulses OSC and OSCB input thereto are in an opposite phase relationship in which active levels of the pulses do not overlap each other. Therefore, it performs an efficient charge pump operation through alternative operations in response to the input pulses.

While the MOSFETs Q61 and Q63 may basically have a diode type configuration, a level loss results in an amount corresponding to their threshold voltages. When the high level of the pulse signal OSC is a low voltage like 3.3 V, the operation is substantially disabled. By taking advantage of the fact that the MOSFET Q61 is only required to be turned on when the input pulse OSC is at the low level, an inverter circuit N10 for generating a pulse similar to the input pulse, a capacitor C11 and a switch MOSFET Q59 are provided to generate a control voltage which is a negative voltage. This makes it possible to transmit a negative potential at the capacitor C13 to the substrate potential VBB without any level loss. The MOSFET Q59 is turned on to charge up the capacitor C11 when a negative voltage is generated by the other input pulse OSCB. The capacitor C11 has a small size which is only sufficient to generate the control voltage for the MOSFET Q61.

The MOSFET Q63 is quickly turned off when it receives an output signal at a high level from a driving inverter circuit N13 which receives the other input pulse OSCB at a back gate (channel region) thereof, which allows the substrate potential to be pulled out with improved efficiency. Similarly, an output signal from a driving inverter circuit N12 is supplied to a back gate of the MOSFET Q61 to turn the MOSFET Q61 off quickly when the capacitor C13 is charged up, which minimizes the leakage of the substrate potential VBB. A pulse signal generated by the inverter circuit N13 and a capacitor C14 operating similarly and a pulse signal generated based on the input pulse OSC are used as a control voltage supplied to the gate of the MOSFET Q62 associated with the other input pulse OSCB and a back gate voltage of the MOSFETs Q64 and Q62.

A MOSFET Q65 (Q66) is provided to pull out the gate voltage of the MOSFETs Q59 and Q63 (Q60 and Q64) quickly. The MOSFET Q65 (Q66) has a diode type configuration in which the gate and drain are commonly connected and is controlled for complementary switching with the MOSFET Q63 (Q64) by the output signal supplied to the back gate thereof from the driving inverter circuit N12 (N13) which receives the input pulse OSC (OSCB) from itself. As a result, when the output signal of the driving inverter circuit N12 (N13) changes to the low level in accordance with the input pulse OSC (OSCB), the MOSFET Q63 (Q64) can be switched from the on state to the off state quickly. This makes it possible to pull the substrate potential toward the negative voltage efficiently.

Figure 21:
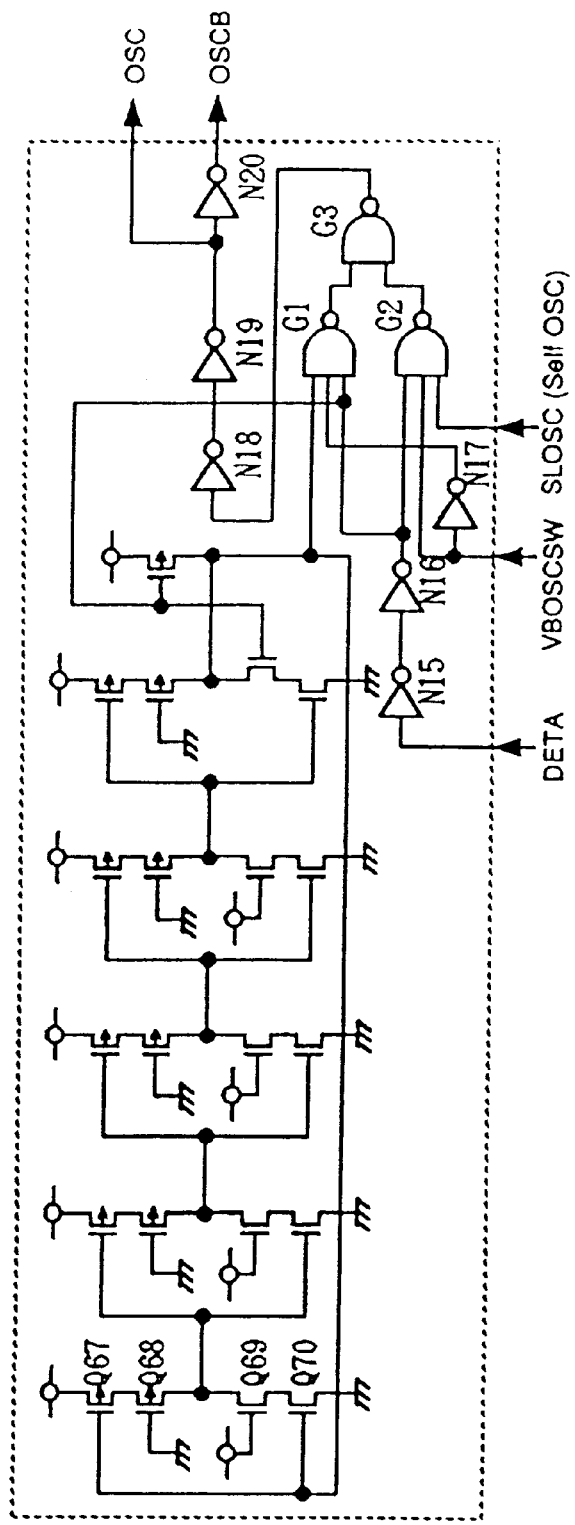
FIG. 21 is a circuit diagram of an embodiment of the oscillation circuit 6 for VBB in FIG. 2.

FIG. 21 is a circuit diagram of an embodiment of the oscillation circuit 6 for generating an oscillation pulse supplied to the charge pump circuit 7 for VBB. In this embodiment, a p-channel type MOSFET Q68 and an n-channel type MOSFET Q69 acting as resistive elements are respectively connected in series to a p-channel type MOSFET Q67 and an n-channel type MOSFET Q70 forming a CMOS inverter circuit, and they form a time constant circuit in combination with an input capacity of a CMOS inverter circuit downstream thereof to perform signal delaying. A number of such CMOS inverters (five in FIG. 21) are cascaded to form a ring oscillator.

A control circuit is provided to operate the ring oscillator intermittently, in other words, to stabilize the substrate voltage VBB and to reduce power consumption by sfopping the operation of the oscillation circuit when the substrate voltage VBB reaches a predetermined negative voltage (on the order of −1.0 V). A signal DETA is a signal generated by a level sensor to be described later which is set at a low level when it is determined that the substrate voltage VBB has reached a predetermined potential. The low level of the signal DETA sets an output signal which has passed through the inverter circuits N15 and N16 at a low level. This turns off an n-channel type MOSFET acting as a resistive element provided at the CMOS inverter circuit at the final stage of the ring oscillator, turns on a p-channel type MOSFET provided at an output terminal of the same and fixes the output of the final stage at a high level by force. The output of the gate circuits G1 and G2 is set at a high level and the output signal of the gate circuit G3 is set at a low level to fix the oscillation pulses OSC and OSCB at low and high levels, respectively.

A signal VBOSCSW is a signal which is set at a high level when the memory is in a standby mode, and the high level of the signal VBOSCSW causes the gate of the gate circuit G1 to close and causes the gate circuit G2 to open to use an oscillation pulse SLOSC for a built-in self-refresh timer as the oscillation pulses OSC and OSCB supplied to the charge pump circuit instead of a relatively high frequency generated by the ring oscillator. During an operation of the charge pump circuit at such a low frequency, the low level of the signal DETA also causes the gate of the gate circuit G2 to close to fix the oscillation pulses OSC and OSCB at the low and high levels, respectively.

Figure 22:
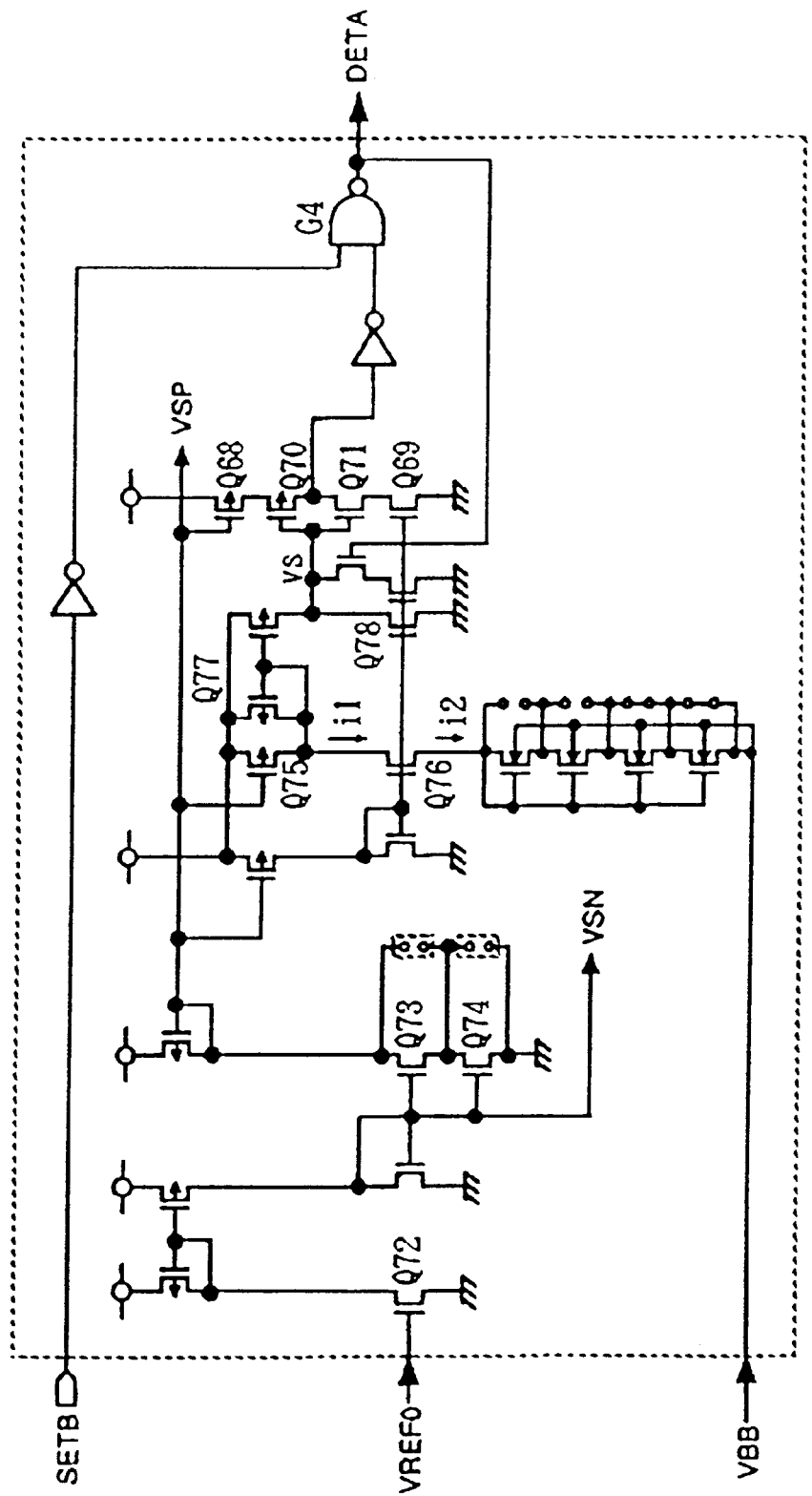
FIG. 22 is a circuit diagram of an embodiment of the level sensor 8 for VBB in FIG. 2.

FIG. 22 shows a circuit diagram of an embodiment of the level sensor 8 for VBB. A constant current is generated by an N-channel type MOSFET Q72 to which the constant voltage VREFO is applied between the gate and source thereof, and a current mirror circuit generates a reference current is based on the same current. The substrate voltage VBB is supplied by connecting a plurality of n-channel type MOSFETs in series in the current path. The plurality of series MOSFETs are provided with terminals for adjustment to adjust process-related variations of the device. Specifically, a current i2 that flows through such series connected MOSFETs when the substrate voltage VBB is −1.0 V as described above is balanced with the current i1. That is, the source potential of a MOSFET Q76 is matched with the ground potential VSS to adjust the balance between the current i2 flowing through the MOSFET Q76 and the current i1 to serve as a reference. In order to also allow the adjustment of the current i1 to serve as a reference, two MOSFETs Q73 and Q74 are also connected in series to the n-channel type current mirror circuit to adjust the mirror current ratio through selective shorting between the sources and drains.

When the substrate voltage VBB is smaller in absolute value than the set voltage, the source potential of the MOSFET Q76 becomes higher than the ground potential to establish a relationship expressed by current i2<i1. As a result, no current flows through a p-channel type MOSFET Q77 provided in parallel with the p-channel type MOSFET Q76 through which the reference current i1 flows, and a voltage vs is set at a low level in accordance with a current difference between itself and an n-channel type MOSFET Q78 through which a current associated with the current i1 flows. The low level signal vs is amplified by the CMOS inverter circuit formed by the MOSFETs Q68 through Q71 and is further output as the sense output DETA through an inverter circuit and a gate circuit G4.

The high level of the sense output DETA forms a current path in parallel with the MOSFET Q78 to pull the signal vs toward a low level. When the substrate voltage VBB become s greater in absolute value than a predetermined voltage, reversal expressed by i2>i1 occurs, and a current difference flows into a p-channel type MOSFET Q77 to raise the voltage vs toward a high level. When the potential vs increases beyond a logic threshold of the CMOS inverter circuit, the sense output DETA changes to a low level which is fed back to turn off the n-channel type MOSFET that has pulled the voltage vs toward the low level, thereby increasing the voltage vs to a high level abruptly. Such a feedback circuit provides the level determination by the CMOS inverter circuit with hysteresis characteristics. Such hysteresis characteristics make it possible to control the intermittent operation of the oscillation circuit with stability and to set the substrate voltage VBB within the range of about 10% of the set value with stability.

A signal SETB is a signal which is temporarily set at a high level immediately after the power supply is turned on, and the high level of the signal SETB forcibly sets the sense output DETA at a high level to activate the oscillation circuit. Voltages VSN and VSP are used as bias voltages for operating a CMOS inverter circuit for determining the high and low levels of the volt age vs and the like with small current consumption.

Figure 23:
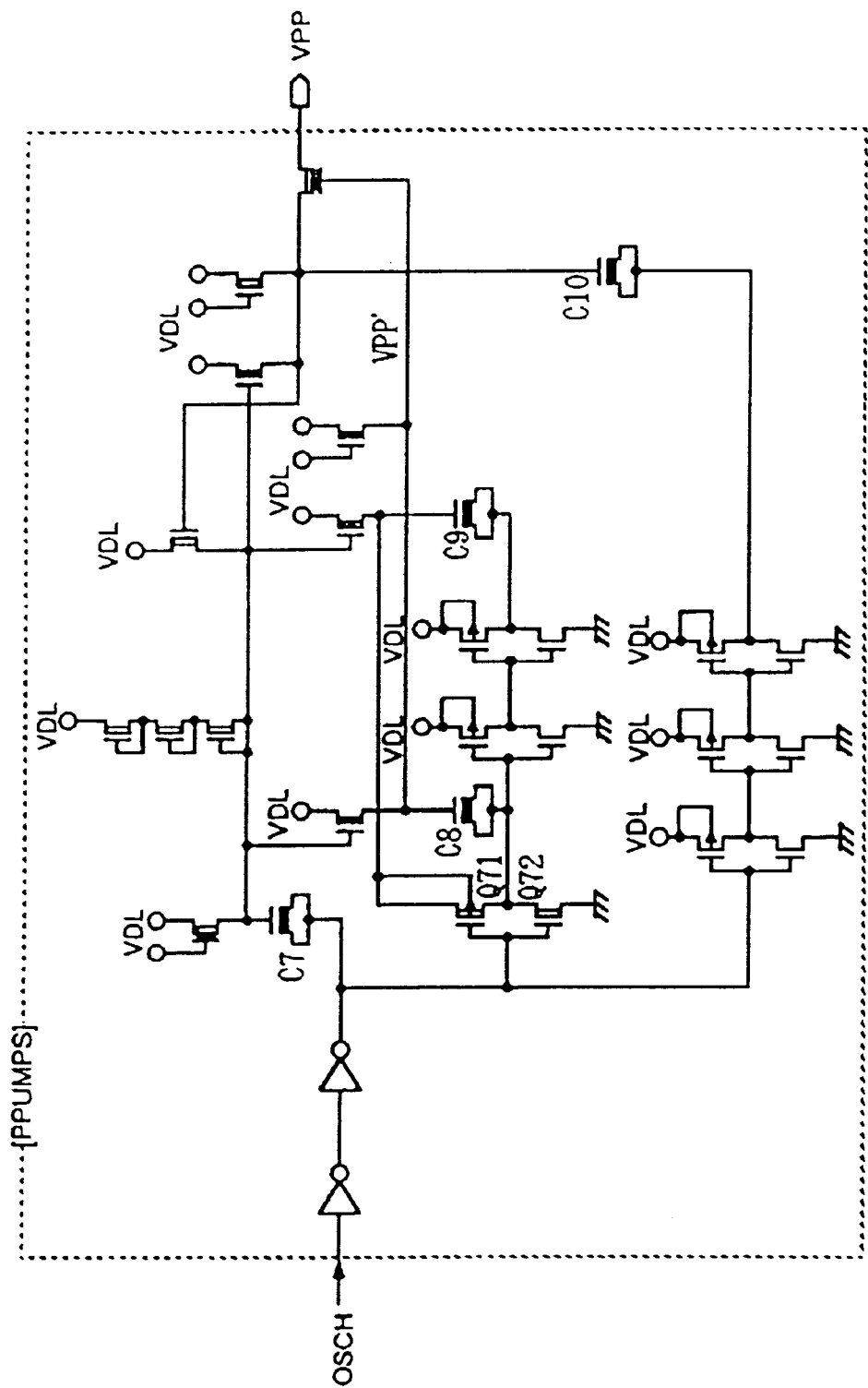
FIG. 23 is a circuit diagram of an embodiment of the charge pump circuit 2 for VPP in FIG. 2.

FIG. 23 is a circuit diagram of an embodiment of a charge pump circuit 2 for VPP. In this embodiment, the internal low voltage VDL is used as an operating voltage to generate the high voltage VPP with stability without being adversely affected by fluctuations of the power supply voltage supplied through the external terminal. When an oscillation pulse OSCH is at a high level, capacitors C8, C9 and C10 are charged up to the internal low voltage VDL. Since a MOSFET for charging up with a boosting voltage generated by a capacitor C7 is turned on during this charge up operation, the charge up is performed to the voltage VDL without any level loss attributable to the threshold voltage thereof.

When the oscillation pulse OSCH changes to a low level, the capacitor C7 is charged up, and a boosting voltage of 2VDL is generated at a capacitor C10. Since the operating voltage of a CMOS inverter circuit formed by MOSFETs Q71 and Q72 is a boosting voltage of 2VDL generated by the capacitor C9, the capacitor C8 is supplied with such a voltage 2VDL and therefore generates a boosting voltage VPP' of 3VDL to turn an output MOSFET on. As a result, the boosting voltage of 2VDL generated by the capacitor C10 is output as a boosting voltage VPP as it is without any level loss.

Since the internal low voltage VDL is about 1.5 V as described above, a maximum boosting voltage VPP of about 3 V can be generated with the charge pump circuit of the embodiment. According to this embodiment, since a boosting voltage on the order of 2.6 V is sufficient as described above, a boosting voltage VPP of 2.6 v as described above is generated by an intermittent operation of an oscillation circuit to be described later.

Figure 24:
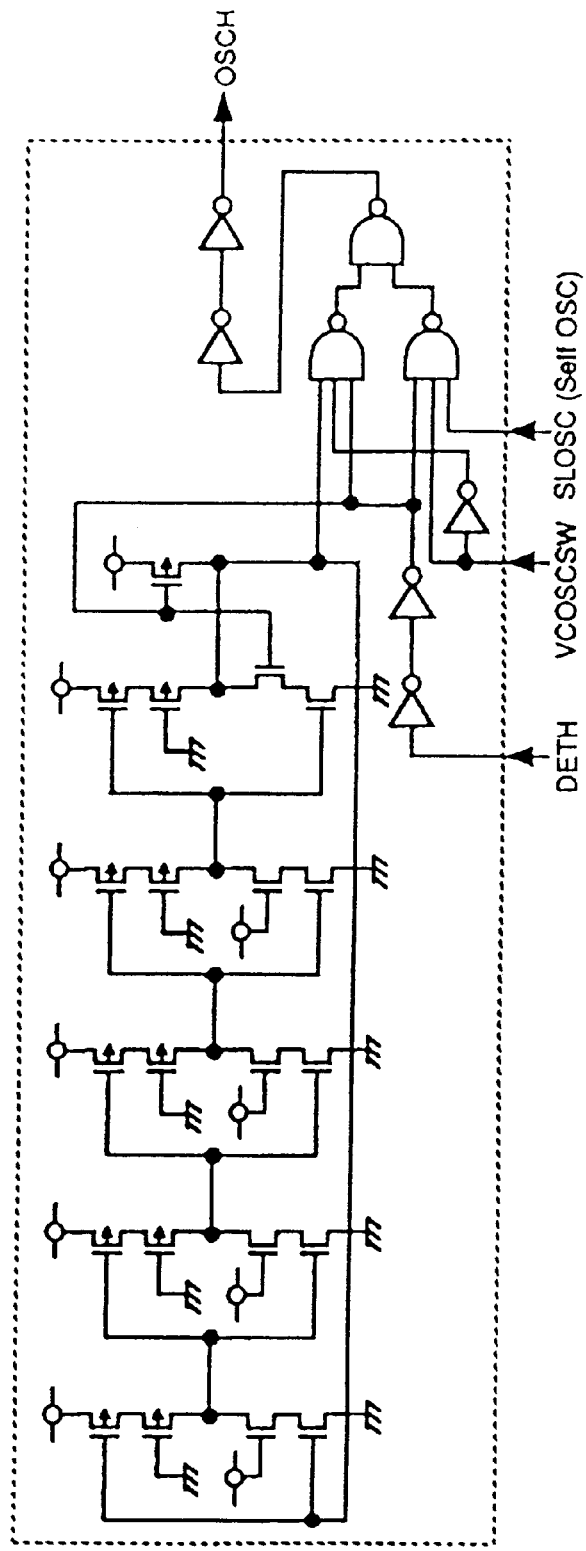
FIG. 24 is a circuit diagram of an embodiment of the oscillation circuit 1 for VPP in FIG. 2.

FIG. 24 is a circuit diagram of an embodiment of the oscillation circuit 1 for VPP. The oscillation circuit 1 used in this embodiment is substantially the same as the oscillation circuit 6 for VBB. A difference exists only in that only one pulse such as the oscillation pulse OSCH is output for a charge pump circuit as described above.

Figure 25:
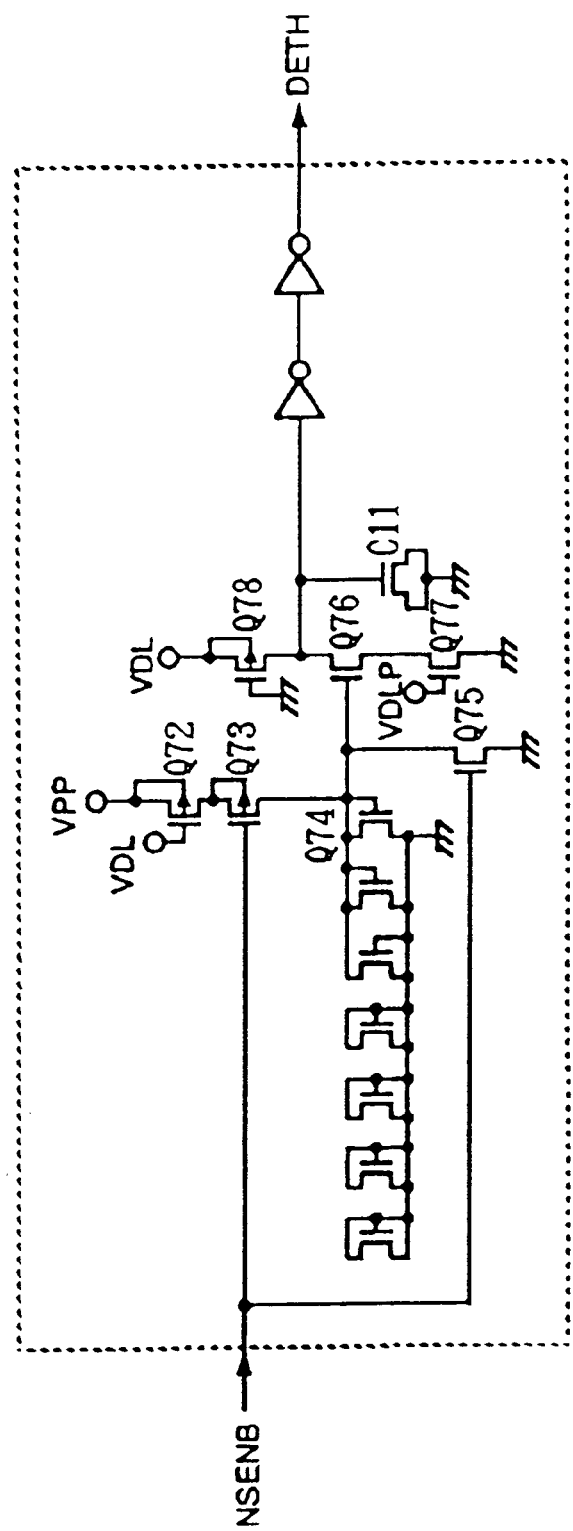
FIG. 25 is a circuit diagram of an embodiment of the level sensor for VPP in FIG. 2.

FIG. 25 is a circuit diagram of an embodiment of the level sensor 3 for VPP. In this embodiment, a boosting voltage VPP is applied to the source of a p-channel type MOSFET Q72 that receives the internal low voltage VDL. The MOSFET Q72 is provided with a MOSFET Q73 which is supplied with an activation signal NSENB that is temporarily set at a low level when the power supply is turned on.

The MOSFET Q74 is normally in an on state in which it divides the boosting voltage VPP with its resistance ratio to an n-channel type MOSFET Q74. The divided voltage is determined by a logic threshold of an inverter circuit formed by n-channel type MOSFETs Q76, Q77 and Q78.

Specifically, when the boosting voltage is higher than a set value, the divided voltage becomes higher than the logic threshold voltage to generate an output signal at a low level which is amplified through two stages of CMOS inverter circuits to set the sense output DETH at a low level. This stops the operation of the oscillation circuit. When the boosting voltage falls below the set value, the divided voltage falls below the logic threshold voltage. As a result, an output signal at a high level is generated and is amplified through two stages of CMOS inverter circuits to set a sense output DETH at a high level. This resumes the operation of the oscillation circuit. When the power supply is turned on, the signal NSENB is set at a high level to turn the p-channel type MOSFET Q73 in the VPP sense path off and to turn an n-channel type MOSFET Q75 on thereby turning the amplifier MOSFET Q76 off. This sets the sense output DETH at the high level by force to cause the oscillation circuit to operate.

Figure 26:
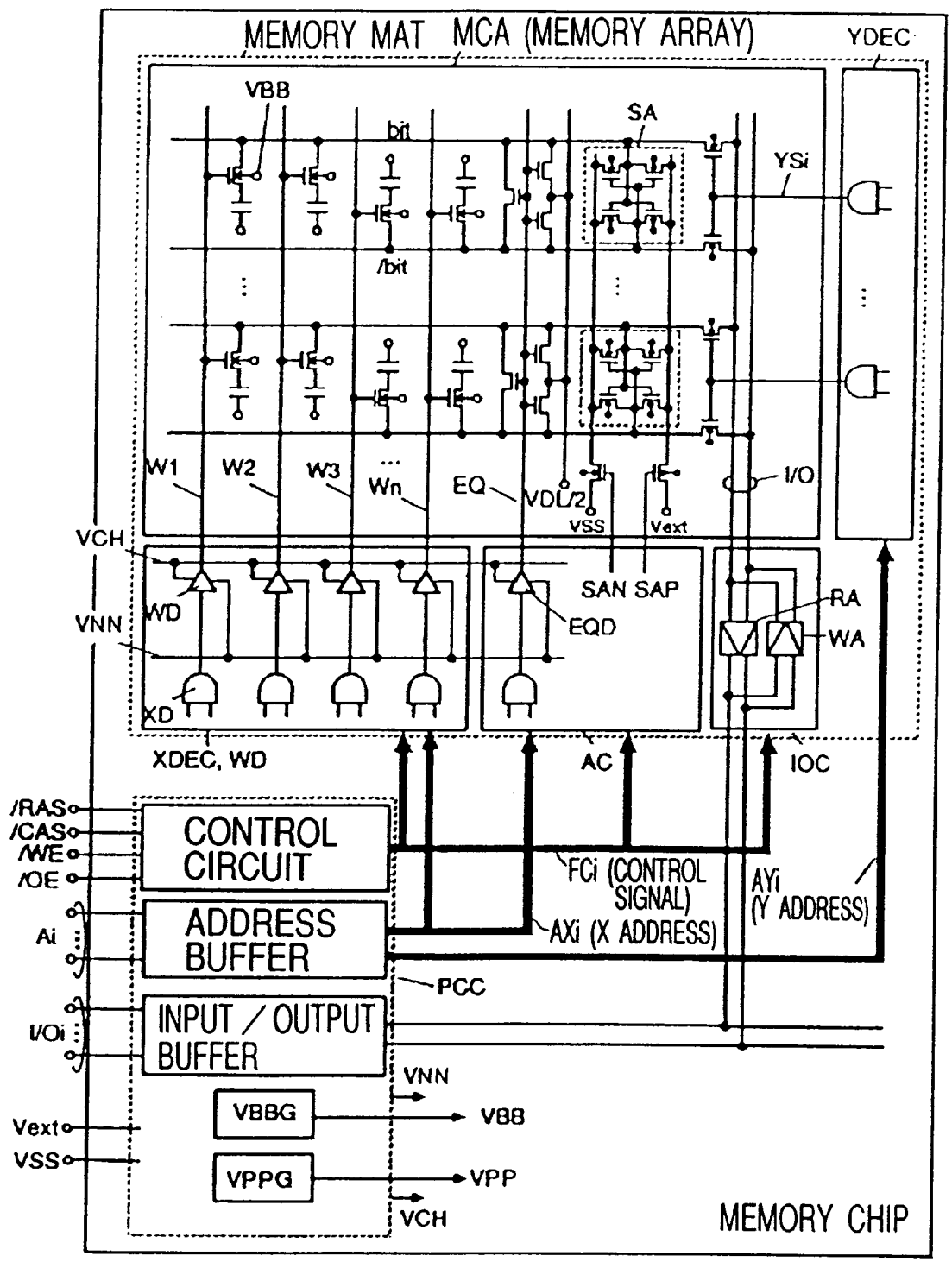
FIG. 26 is a schematic diagram of an embodiment of a dynamic RAM according to the invention as a whole.

FIG. 26 shows the overall configuration of an embodiment of a dynamic RAM according to the invention. The dynamic RAM comprises a memory cell array MCA which is a matrix of memory cells for storing information, an X-decoder XDEC for selecting one memory cell from among them in the case of access on a bit-by-bit basis and for selecting a plurality of memory cells in the case of access based on a plurality of bits, a word driver WD and a Y-decoder YDEC and a control circuit which receives and controls an external control signal /RAS (row address strobe), /CAS (column address strobe), /WE (write enable) and /OE (output enable).

A memory cell of the dynamic RAM is formed by one capacitor and one transistor (MOSFET) as described above. In FIG. 26, WD represents word drivers as described above which drive output word lines Wi (i=1 through n). The word drivers WD are selected with X-decoders XDEC upstream thereof. SA represents a sense amplifier; -bit- and -/bit- represent bit lines; and AC represents an array control circuit. The array control circuit AC outputs a bit line equalize signal EQ and a sense amplifier activation signal. IOC is provided with a read amplifier (main amplifier) RA and a write amplifier WA for selecting I/O lines and amplifying data during read and write operations.

A memory reading operation is started when the signal EQ is set at a high level (VCH) to equalize the bit lines. The signal EQ is set at a low level (VNN) to cancel the equalization, and the word lines rise from the negative voltage VNN to a selection level such as VCH. As a result, the memory cells connected to the word lines assert signals. Next, sense amplifiers are activated by sense amplifier activation signals SAP and SAN. This sets the signals on the bit lines at a high level such as an external voltage Vext or the internal low voltage VDL (not shown) and a low level such as the ground potential VSS. Column selection switches attached to the bit lines are selected by the output of the Y-decoder YDEC to connect the bit lines to the input/output lines I/O and to output data from the chip through the read amplifier RA and an output buffer included in an input/output buffer.

Referring to a memory write operation, an input buffer included in the input/output buffer is enabled during a selecting operation as described above to write data input from the outside of the chip into the capacitors of memory cells through the write amplifier WA, input/output lines I/O, column selection switches and bit lines.

The present embodiment includes a charge pump circuit VBBG for generating a negative back bias voltage VBB in the p-type well region where the memory cells are formed with a substrate voltage generation circuit as an internal power supply circuit, and a constant voltage circuit as described above (not shown) using the voltage VBB to generate the negative voltage VNN as a non-select level of the word lines. A charge pump circuit VPPG generates the boosting voltage VPP based on which constant voltage circuit (not shown) generates a high voltage corresponding to the select level VCH of the word line. The high voltage VCH fully writes the high level of the bit lines as it is without being affected by the threshold voltage of the MOSFETs that constitute the memory cells. The substrate voltage VBB has the function of reducing the p-n junction capacitance of the bit lines and sense amplifiers, increasing the threshold voltage of the MOSFETs of the memory cells to improve data retention characteristics and absorbing minority carriers induced by α-rays to reduce software errors.

An address signal Ai for selecting the memory cells is supplied to the decoders XDEC, YDEC and the like through an address buffer. The dynamic RAM employs the address multiplex system in which an X-system address signal is input in synchronism with the /RAS signal and a Y-system address signal is subsequently input in synchronism with the /CAS signal. The address buffer includes an address latch circuit which maintains the address signals input in a time sequence. Although not shown, information charges accumulated in the capacitors are lost as time passes in a dynamic memory cell. A refresh operation is therefore necessary to perform reading before the charges are lost and to recover the initial state of charges. Although not shown, the control circuit includes an automatic refresh control circuit for performing the refresh operation at predetermined time intervals.

Figure 27:
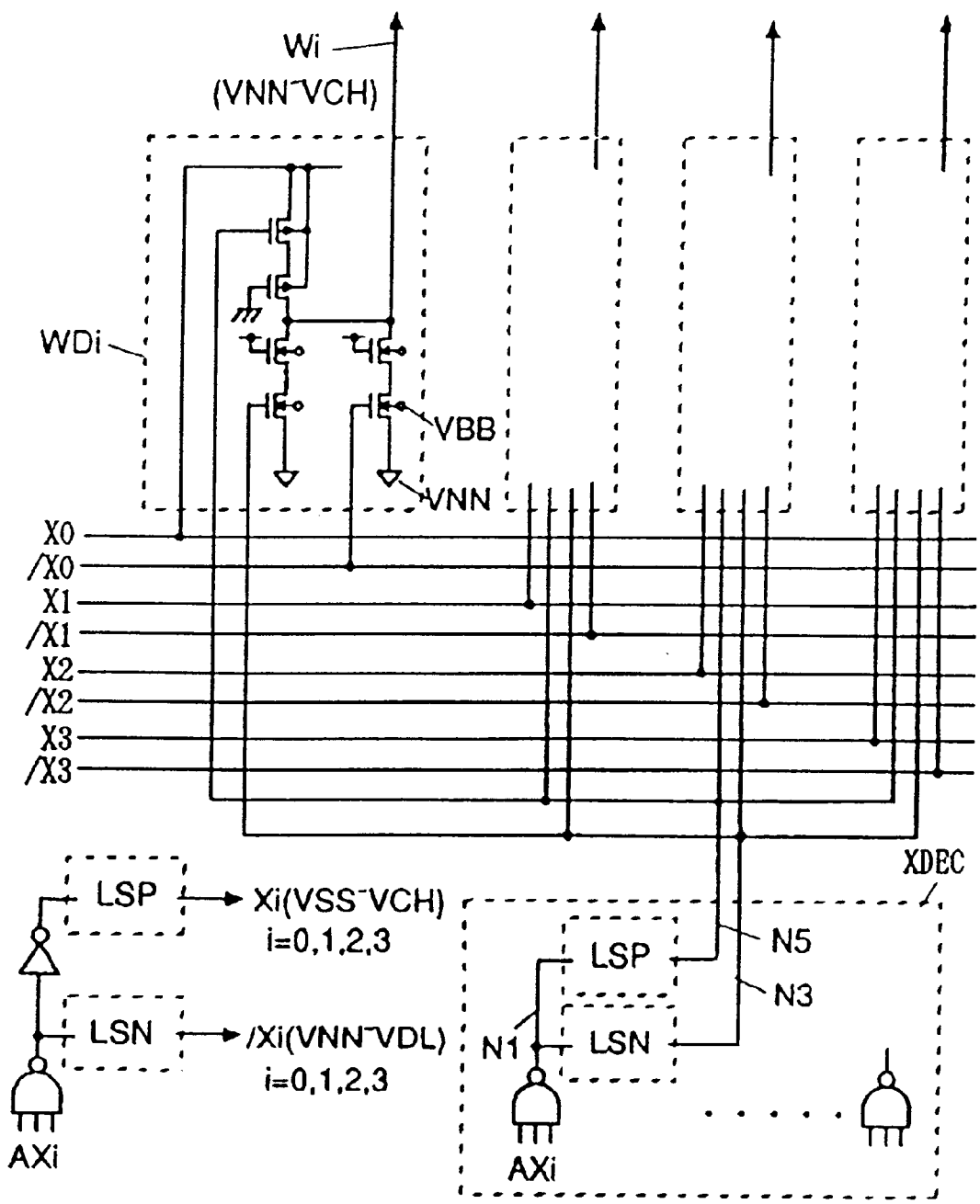
FIG. 27 is a circuit diagram of another embodiment of a word driver of a dynamic RAM according to the invention.

FIG. 27 shows a circuit diagram of another embodiment of a word driver of a dynamic RAM according to the invention. The present embodiment is characterized in that sub word drivers of a hierarchical word line system as described above are used as word drivers in a non-hierarchical system. Specifically, a decode signal X0 is used as the operating voltage of word drivers WDi. This configuration can.lbe applied to memory arrays having a small word line pitch because the switch MOSFETs can be deleted to allow the total number of elements to serve as the word drivers WDi to be reduced to six regardless of the fact that MOSFETs to provide a high withstand voltage are added.

In the present embodiment, a word driver to serve four word lines is allocated to a logic circuit as the X-decoder XDEC for generating a selection signal and two level conversion circuits LSP and LSN for converting the level of the output signal. Alternatively, the above-described four decode signals Xi may be increased to eight to be commonly used by a word driver to serve eight word lines. In this case, since the layout pitch of the X-decoders is relaxed further, the level conversion circuits LSP and LSN can be expanded in the lateral direction to reduce the longitudinal dimension (in the extending direction of the word lines) of the layout pattern.

Figure 28:
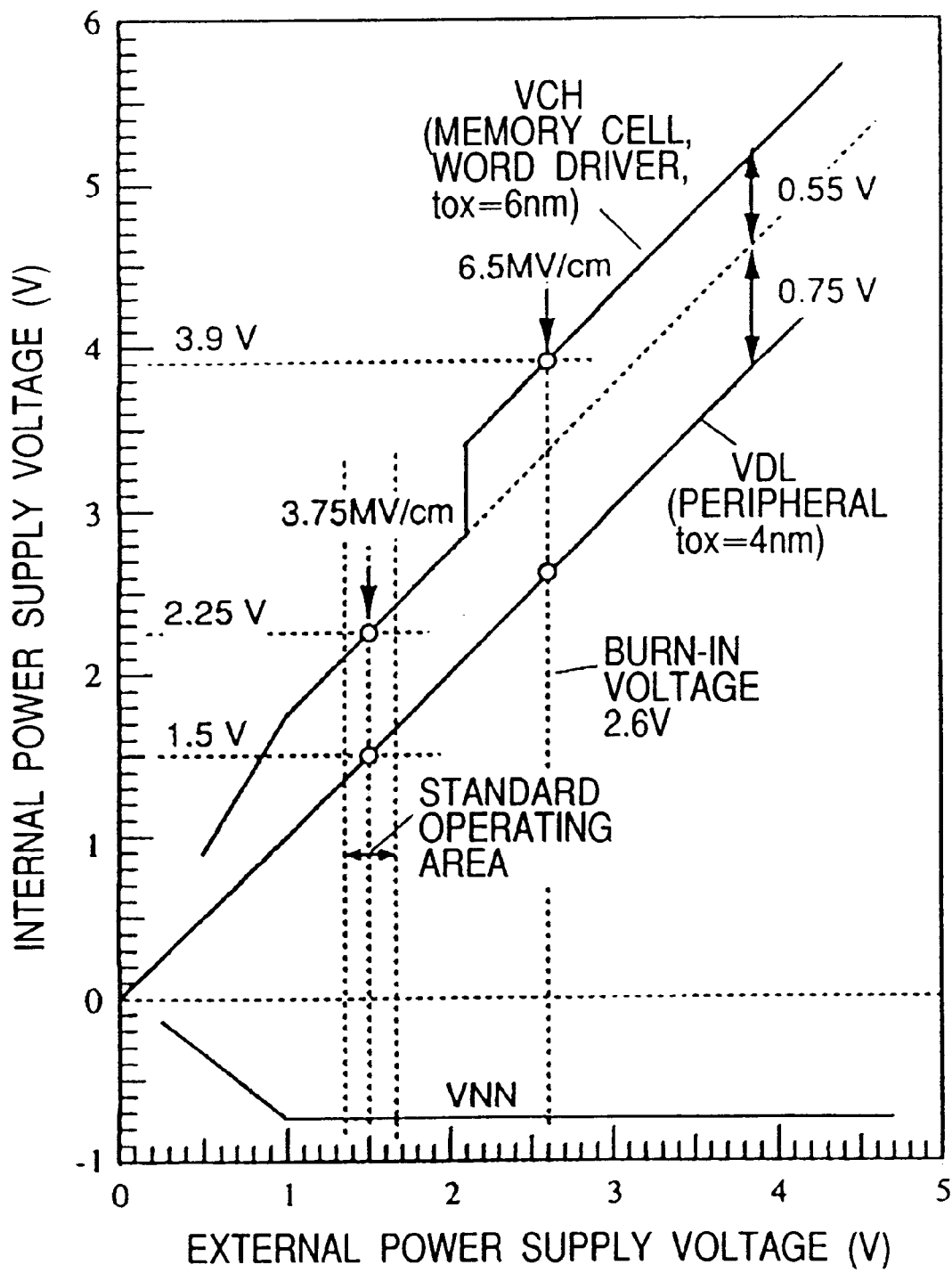
FIG. 28 is a voltage characteristics diagram of an embodiment of a dynamic RAM according to the invention illustrating the relationship between an external voltage and internal voltages VCH, VNN and VDL.

FIG. 28 shows voltage characteristics of an embodiment illustrating the relationship between an external voltage and the internal voltages VCH, VNN and VDL of a dynamic RAM according to the invention. A semiconductor memory is normally subjected to an aging test or burn-in test before shipment in which initial failures are screened by applying a voltage higher than a normally used voltage to eliminate defective devices. The present embodiment facilitates such tests and improves the yield of the tests. In the present embodiment, two types of gate insulation films are provided as described above; the voltages VCH and VDL are increased in proportion to an external power supply voltage with a predetermined level difference maintained between them; and the level difference is varied between a region under a normal operation and a region under burn-in.

On the contrary, the negative voltage VNN is kept at a constant value irrespective of the external power supply voltage. It may alternatively be increased during burn-in. While the difference between the voltages VCH and VDL may be increased by increasing the gradient of the voltage change, the above-described method is advantageous in that the voltage VCH can be easily achieved by simply switching the resistance of the resistor RL2 in FIG. 17 in two steps. Such voltage switching makes it possible to set the voltage accurately in both a region under normal operation and a region under burn-in, which in turn makes it possible to prevent the breakdown of devices due to over-stress and to consequently improve the yield. The voltage VDL is equal to the external voltage Vext.

Figure 29:
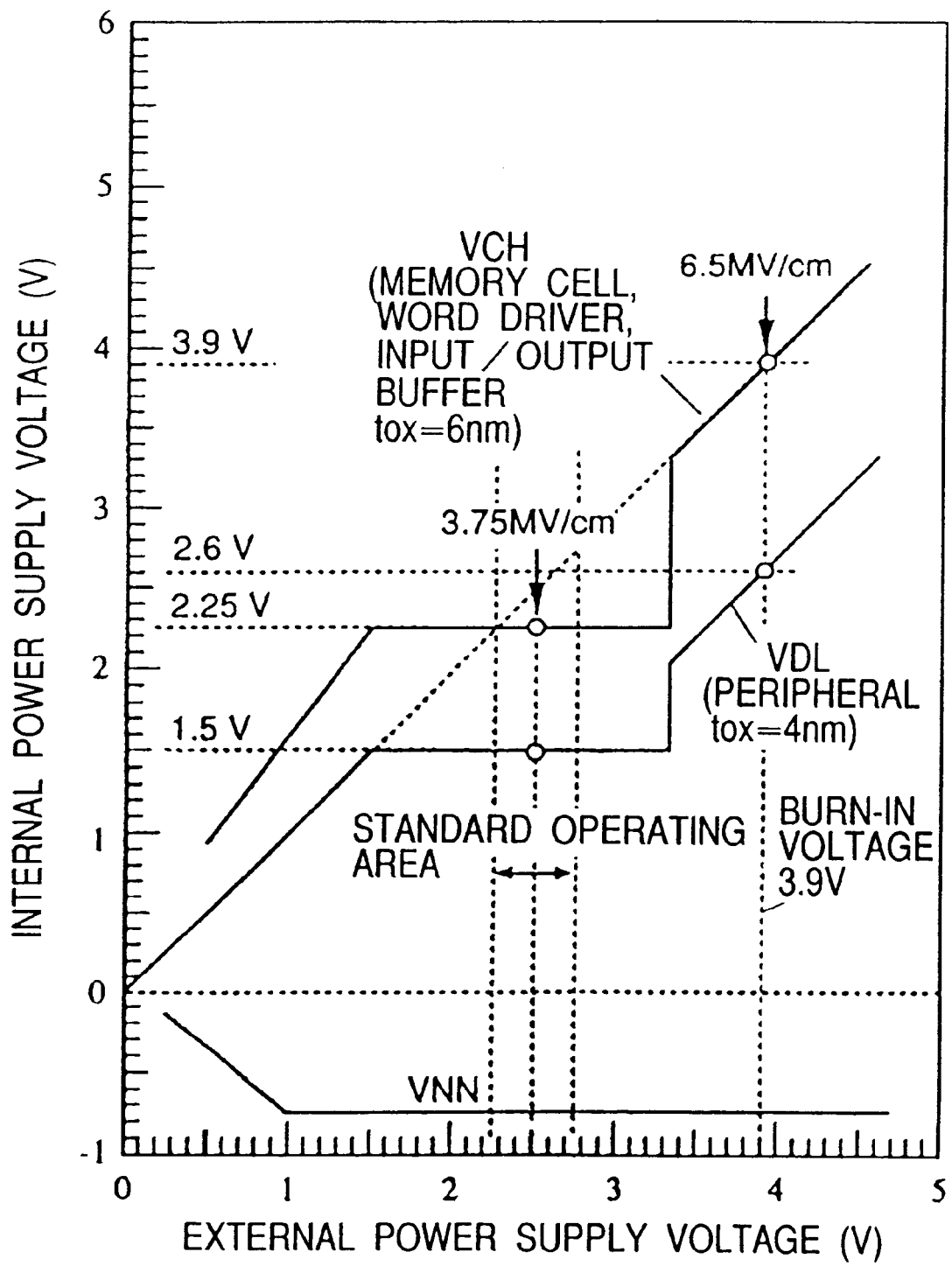
FIG. 29 is a voltage characteristics diagram of another embodiment of a dynamic RAM according to the invention illustrating the relationship between an external voltage and internal voltages VCH, VNN and VDL.

FIG. 29 shows voltage characteristics of another embodiment illustrating the relationship between an external voltage and the internal voltages VCH, VNN and VDL of a dynamic RAM according to the invention. In this embodiment, a voltage limiter is used to decrease and set the internal voltage VDL at 1.5 V in a region under normal operation to allow the use of gate insulation films of the same type as the embodiment shown in FIG. 28 having the same thicknesses when the external power supply voltage is set at 2.5 V. MOSFETs having gate insulation films of the greater thickness out of the two films are used for the input and output buffers in addition to the word drivers and memory cells as described above, and MOSFETs having gate insulation films of the smaller thickness are used for the peripheral circuits and sense amplifiers.

The voltages VCH and VDL are kept at predetermined levels regardless of the external power supply voltage in the vicinity of a region under normal operation and are increased in accordance with the external power supply voltage in the vicinity of a regi-cln under burn-in. Such switching is carried out between a region under normal operation and a region under burn-in similar to the embodiment shown in FIG. 28. The negative voltage VNN is again constant regardless of the external power supply voltage. In this embodiment, the reference voltage VRP for the voltage VCH is also generated based on the voltage VDL as a reference, and the resistance of the resistor RL2 is switched in two steps to increase the voltage difference from the voltage VDL in the region under burn-in. This makes it possible to set the voltage accurately in both of a xegion under normal operation and a region under burn-in, which in turn makes it possible to reduce devices having detects attributable to overstress and to consequently improve the yield of products.

The voltage VDL may be generated by a constant voltage circuit similar to that described above using the reference voltage VREF0 in a region under normal operation and may be switched to a voltage that varies depending on the external power supply voltage instead of the voltage VREF0 in a region under burn-in. The voltage varying depending on the external power supply voltage may be a voltage generated by connecting one end of a resistor to the voltage VDL and connecting the other end to a current mirror circuit constituted by an n-channel type MOSFET which uses the ground potential VSS as a reference.

Figure 30:
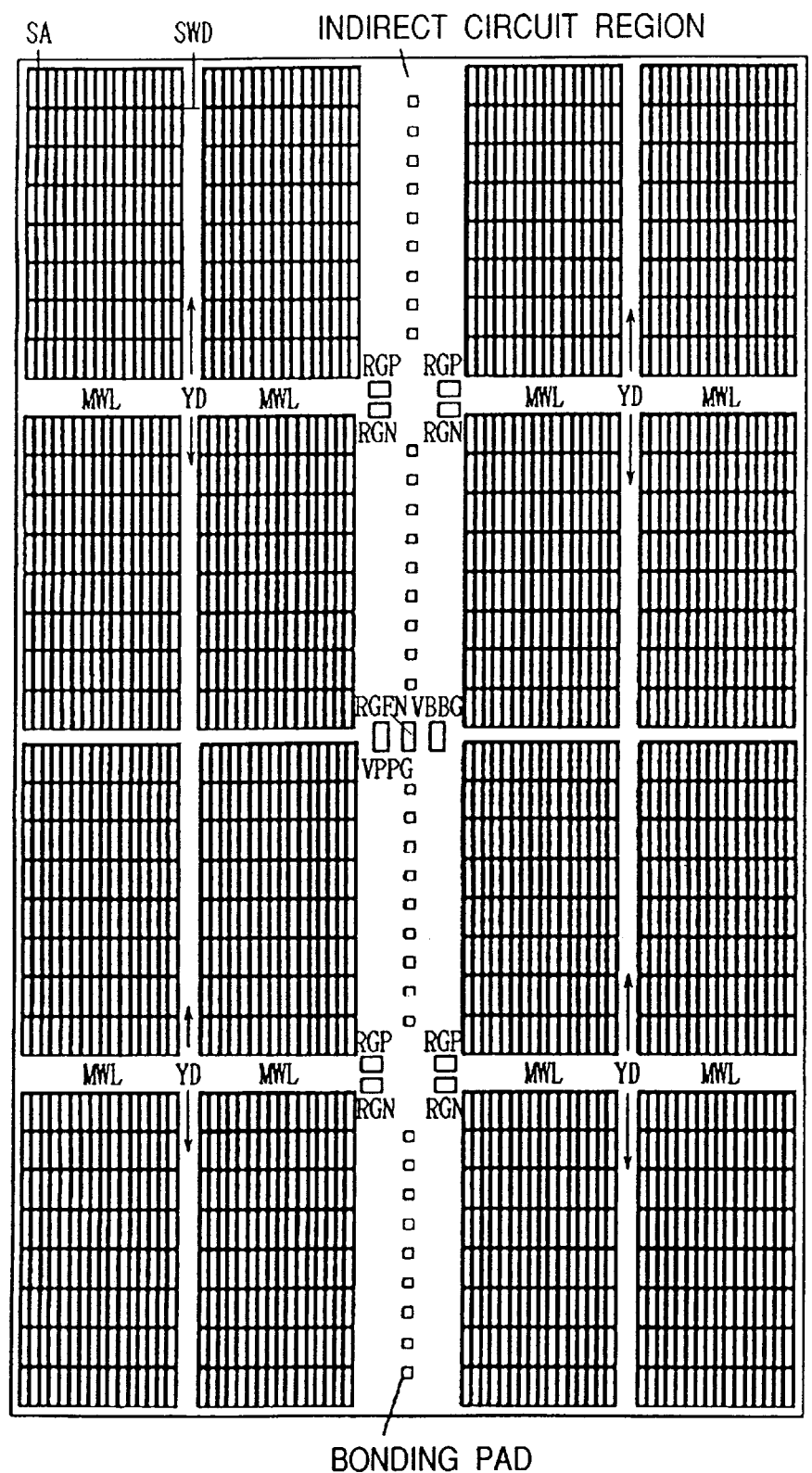
FIG. 30 is a layout diagram illustrating an embodiment of a dynamic RAM having a power supply circuit according to the invention mounted thereon.

FIG. 30 shows a layout of an embodiment of a dynamic RAM, having a power supply circuit according to the invention mounted thereon. According to this embodiment, the memory array is divided into four regions in each of the longitudinal and the lateral direction of a chip and, therefore, a chip as a whole is made up of 16 memory cell arrays. A central region of the chip in the longitudinal direction thereof constitutes an indirect circuit region where bonding pads indicated by the squares placed in the longitudinal direction and peripheral circuits including power supply circuits are provided. In the indirect circuit region, an address buffer circuit, a data input buffer and a data output buffer are appropriately formed in association with the bonding pads.

In each of the 16 memory arrays which are, as described above, two divisions on the left and right sides of the semiconductor chip in the longitudinal direction thereof totaling four divisions, and four divisions in the vertical direction, a main word selection circuit MWL is provided for each of the sections formed by dividing the upper and lower parts of the chip into two in the middle thereof in the longitudinal direction and by dividing the resultant parts into two. Although not shown, main word drivers are formed above and below such a main word selection circuit MWL adjacent to respective memory cell arrays to drive the respective main word lines of the memory arrays which are divided in the vertical direction. A Y-selection circuit YD is provided between each pair of memory cell arrays arranged in the lateral direction of the chip.

In a memory cell array as described above, a plurality of memory mats are arranged in the longitudinal direction and the direction perpendicular thereto (lateral direction). Specifically, one memory cell is divided into eight parts in the longitudinal direction to provide eight memory mats and is divided into sixteen parts in the direction perpendicular thereto to provide sixteen memory mats. In other words, a word line is divided into eight parts, and a bit line is divided into sixteen parts. As a result, the memory cell provided on one memory mat is divided by eight and sixteen as described above to increase the speed of memory access. As will be described later, sense amplifier regions are provided on the left and right sides of a memory mat, as will be described later, and sub word driver regions are provided above and below the same. The sense amplifiers provided in the sense amplifier regions are configured on a shared sense basis and are provided with complementary bit lines extending to the left and right except for the sense amplifiers provided on both ends of the memory cell array to be selectively connected to the complementary bit lines of either of the memory mats located on the left or right sides thereof.

A main word selection circuit MWL and main word drivers are provided for each of the pairs of memory cell arrays provided as described above. A main word selection circuit MWL is provided to be shared by two memory arrays distributed above and below the same. A main word driver generates a selection signal for a main word line extending through one memory array. The main word driver is accompanied by a driver for sub word selection which is extended in parallel with the main word line to generate a selection signal for a sub word selection line as will be detailed later.

Although not shown, one memory mat has 256 sub word lines and 512 pairs of complementary bit lines (or data lines) perpendicular thereto. Since sixteen memory mats are provided in one memory array as described above in the direction of the bit lines, there are about 8000 sub word lines in total and 16000 sub word lines on the chip as a whole. Further, since eight memory mats are provided in one memory array in the direction of the word lines, there are provided about 4000 complementary bit lines in total. Since four such memory arrays are provided in total, there are provided 16000 complementary bit lines in total, which provides a storage capacity as a whole as large as 16 K×16 K=256 Mbits.

One memory cell array is divided into eight parts in the direction of the main word lines. A sub word driver (sub word line driving circuit) is provided for each of the memory cell arrays 15 obtained as a result of such division. The sub word driver generates a selection signal for a sub word line divided into a length which is 1/8 of the main word line and extending in parallel therewith. In this embodiment, to reduce the number of the main word lines, in other words, to relax the wiring pitch of the main word lines, four sub word lines are provided for one main word line in the direction of the complementary bit lines, although this is not a requirement of the invention. A sub word selection driver is provided to select one sub word line from among sub word lines which are eight divisions in the direction of the main word line and four each of which are allocated in the direction of the complementary bit lines. The sub word selection driver generates a selection signal to select one of four sub word selection lines extending in the direction in which the sub word drivers are arranged.

Referring to one memory cell array as described above, a sub word driver associated with one memory, mat including a memory cell to be selected among eight memory cell arrays allocated to one main word line selects one sub word line. As a result, one sub word line is selected from among 8×4=32 sub word lines belonging to one main word line. Since 4K (4096) memory cells are provided in the direction of the main word line as described above, 4096/8=512 memory cells are connected to one sub word line. Eight sub word lines associated with one main word line are put in a selected state during a refresh operation (e.g., a self-refresh mode), although this is not a requirement of the invention.

As described above, one memory array has a storage capacity of 4 K in the direction of the complementary bit lines. However, if as many as 4 K memory cells are connected to one pair of complementary bit linies, the parasitic capacitance of the complementary bit lines increases to prevent a signal level from being read from a minute capacitance ratio between itself and a capacitor for storing information. Therefore, the memory array is divided into sixteen parts also in the direction of the complementary bit lines. Specifically, the complementary bit lines are divided into sixteen parts by the sense amplifier provided between the memory mats. Although this is not a requirement of the invention, the sense amplifiers are configured on a shared sense basis and are provided with complementary bit lines extending to the left and right from the sense amplifiers 16 except for the sense amplifiers provided on both ends of the memory cell array to be selectively connected to the complementary bit lines on either of the left or right sides thereof.

According to this embodiment, two each of the constant voltage circuits RGP and RGN (four in total) are provided in association with the embodiment shown in FIG. 14, although this is not a requirement of the invention. Specifically, two each of the constant voltage circuits (RGP and RGN) are vertically allocated to a string of bonding pads so as to sandwich the same. As a result, a pair of constant voltage circuits (RGP and RGN) operate on four memory cell arrays. Although not limiting the invention, charge pump circuits VPPG and VBBG are provided in the middle of a chip to supply charge pump voltages VPP and VBB to the four constant voltage circuits RGP and RGN. A reference voltage generation circuit RGFN provided in the middle supplies a constant voltage to each of the four pairs of constant voltage generation circuits. This configuration makes it possible to reduce and equalize the distance between the charge pump circuits VPPG and VBBG and the distance between the reference voltage generation circuit RGFN and each of the constant voltage circuits.

Figure 31:
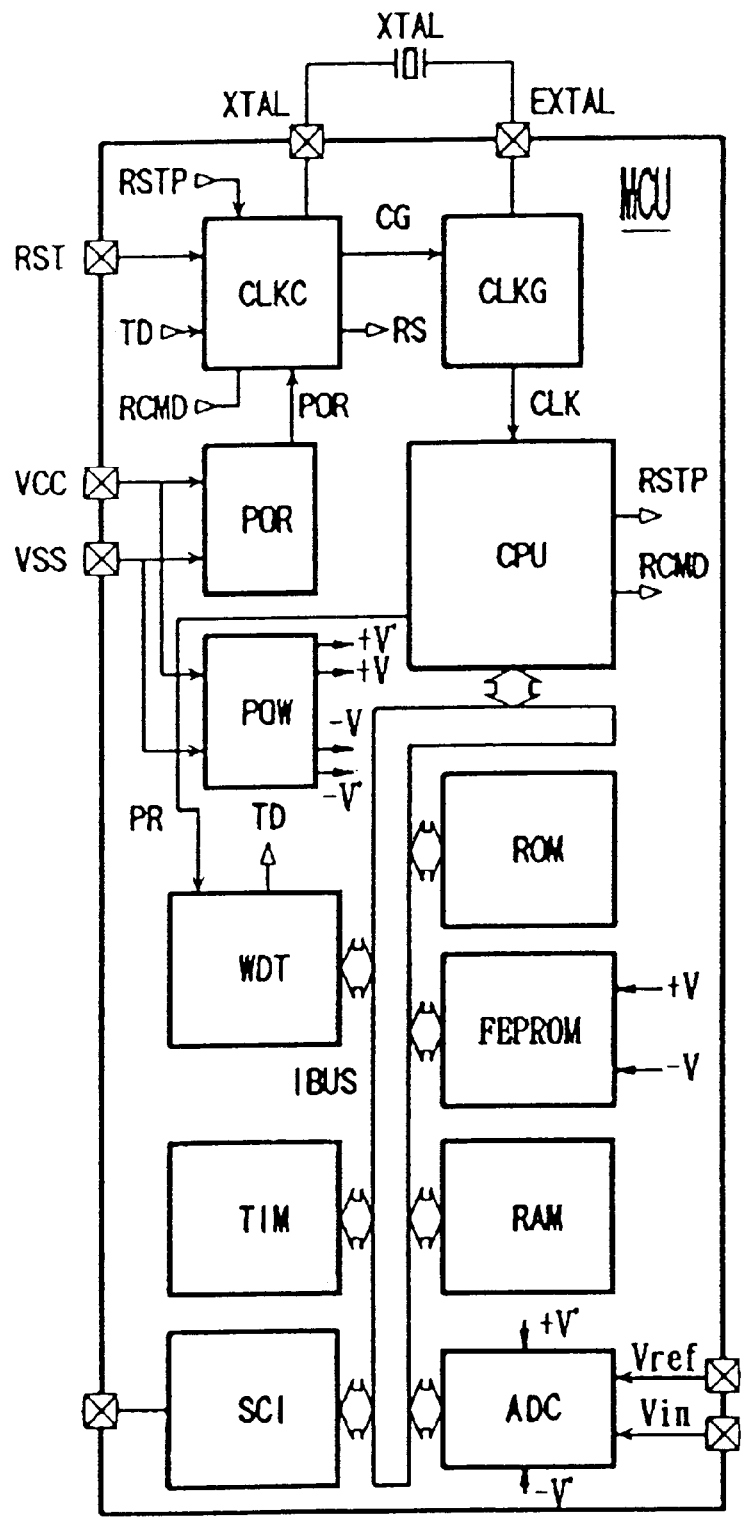
FIG. 31 is a block diagram of an embodiment of a single chip microcomputer embodying the invention.

FIG. 31 shows a block configuration diagram of an embodiment of a single chip microcomputer to which the invention is applied. Although not a requirement of the invention, the single chip microcomputer MCU of this embodiment is incorporated in an automobile, an industrial machine or the like to function as a controller for the same.

The microcomputer MCU in FIG. 31 is a central processing unit CPU of the so-called stored program type. Although not a requirement of the invention, the central processing unit CPU is coupled through an internal bus IBUS to a read only memory ROM, a random access memory RAM, an analog-to-digital conversion circuit A-D, a watch dog timer WDT, a timer circuit T1 and a serial communication interface SCI. A predetermined clock signal CLK from a clock generation circuit CLKG is supplied to various parts of the microcomputer MCU including the central processing unit CPU, and the microcomputer MCU further includes a clock controller CLKC for controlling the clock generation circuit CLKG and a power on reset circuit POR for resetting each part of the microcomputer MCU to the initial state when the power supply is turned on.

An internal signal PR is supplied from the central processing unit CPU to the watch dog timer WDT, and an output signal of the same, i.e., an abnormality detection signal TD is supplied to the clock controller CLKC. One of the input terminals of the clock generation circuit CLKG is coupled to one of the electrodes of a crystal oscillator XTAL through an external terminal EXTAL, and a clock output signal CG from the clock controller CLKC is supplied to the other input terminal. The other electrode of the crystal oscillator is coupled to the clock controller CLKC through the external terminal XTAL.

A power supply voltage VCC as the operating power supply of the single chip microcomputer MCU and a ground potential VSS are supplied to the power on reset circuit POR through external terminals VCC and VSS, respectively, and an output signal of the same, i.e., a power on reset signal POR, is supplied to the clock controller CLKC. The clock controller CLKC is also supplied with an output signal RSTP of a full stop control register RSTP and an output signal RCMD of a mode control register RCMD from the central processing unit CPU, and an output signal of the same, i.e., a normal reset signal RS is supplied to various parts of the microcomputer MCU including the central processing unit CPU.

The central processing unit CPU operates step by step in accordance with a user program stored in the read only memory ROM to execute predetermined arithmetic processes and to control and orchestrate various parts of the microcomputer. The central processing unit CPU of this embodiment includes a full stop control register and a mode control register which are writable in accordance with instructions, and output signals RSTP and RCMD from the same are supplied to the clock controller CLKC as described above. An internal signal RP indicating the state of execution of programs in the central processing unit CPU is continually monitored by the watch dog timer WDT to be used for the detection of an abnormality by the microcomputer MCU. The read only memory ROM is constituted by, for example, a mask ROM having a predetermined storage capacity and which stores programs and fixed data required for the control of the central processing unit CPU. The random access memory RAM is constituted by, for example, a static RAM having a predetermined storage capacity and which temporarily stores results of calculations at the central processing unit CPU, control data and the like. A flash EPROM is a ROM which can be electrically rewritten for storing data to be maintained when the power supply is disconnected.

The analog-to-digital conversion circuit A-D converts analog input signals supplied by various external sensors into digital signals having a predetermined number of bits and transmits them to the central processing unit CPU and the like through the internal bus IBUS. In this embodiment, a reference voltage Vref used for generating a precharge/discharge voltage as described above is supplied. The reference voltage Vref may be also supplied to the A-D converter to be used as a reference voltage for the A-D conversion operation. A sampling clock and a precharge/discharge clock used for sample hold means and precharge/discharge means as described above included in the analog-to-digital converter A-D are generated based on the clock generated by the clock generation circuit CPG. This equally applies to a clock signal to be used for the A-D converter A-D itself.

The timer circuit TIM measures time in accordance with the clock signal supplied by the clock generation circuit CPG, and the serial communication interface SCI supports for example, data transfer at a high speed between a serial input/output device externally coupled to the microcomputer and the random access memory RAM.

The watch dog timer WDT monitors the internal signal PR output by the central processing unit CPU. When the internal signal PR is not generated beyond a predetermined time, i.e., when instruction fetch is not carried out by the central processing unit CPU for a long period, an abnormality of the central processing unit, i.e., the microcomputer, is detected and the output signal or abnormality detection signal TD is selectively set at a high level. The power on reset circuit POR monitors the potential of the power supply voltage VCC and the ground potential VSS supplied through the external terminals VCC and VSS and temporarily sets the output signal thereof or power on reset signal POR at a high level for a predetermined period immediately after the operating power supply is turned on. The abnormal detection signal TD from the watch dog timer WDT and the power on reset signal POR from the power on reset circuit POR are supplied to the clock controller CLKC.

The single chip microcomputer or the like incorporated in an automobile or an industrial machine or the like may be provided with a clock controller capable of selectively stopping the operation of the clock generation circuit in response to the detection of an abnormality by the watch dog timer and of writing to a predetermined register in accordance with an instruction from the central processing unit. By allowing the full stop state to be cancelled only by the power on reset signal when the power supply is turned on again, the operation of the microcomputer or the like can be fully stopped in case of an abnormality until the operating power supply is turned on again after disconnection.

A power supply circuit POW as described above is provided to generate internal voltages such as internal voltages +V, +V', -V and -V' of the microcomputer as described above. The power supply circuit generates stable internal voltages +V, +V', -V and -V' through combinations of the charge pump circuit and constant voltage circuits.

Although not a requirement of the invention, the voltages +V and -V are high voltage such as 12V and -12V which are to be used as voltages for writing and erasing the FEPROM.

This makes it possible to rewrite the FEPROM in a state wherein it is loaded on the system. The voltages and -V and -V' are operating voltages for the A-D converter. Since the A-D converter operates on the two positive and negative voltages, an analog signal can be directly input from an external terminal. That is, since an analog signal can be input without providing a coupling capacity to prevent a direct current as in an A-D conversion circuit operating on one power supply, it is possible to accept even an input signal having a low frequency and to eliminate the need for an external large capacity.

Figure 32:
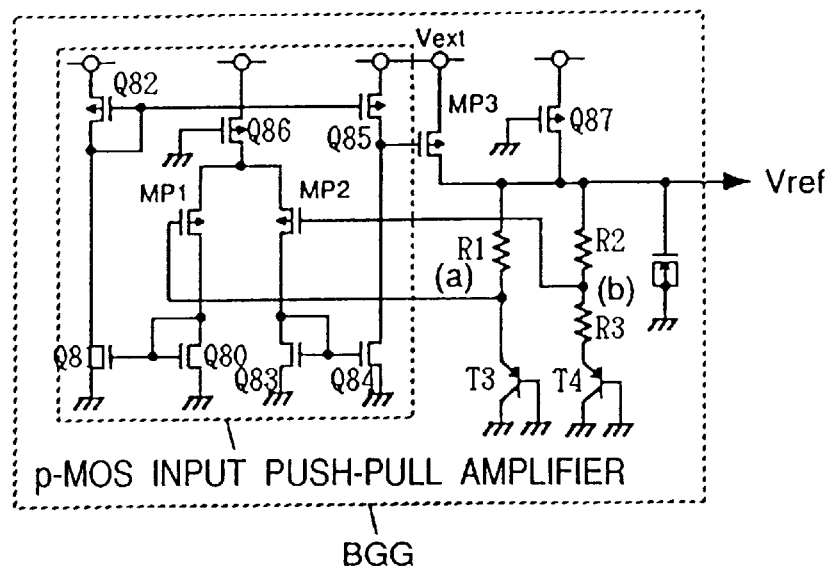
FIG. 32 is a circuit diagram of another embodiment of a reference voltage generation circuit according to the invention.

FIG. 32 is a circuit diagram of another embodiment of a reference voltage generation circuit according to the invention. In this embodiment, a p-channel type MOSFET is used as an input transistor to allow a sufficient current to flow through the differential amplifier even if the threshold voltage of the MOSFETs significantly increases, and there is provided a push-pull conversion circuit having a double end configuration to allow the p-channel output buffer to be driven as in the prior art.

Potentials at nodes (a) and (b) generated by the voltages between the bases and emitters of the transistors T3 and T4 are as low as 0.6 V to 0.7 V. Therefore, in the circuit of the embodiment shown in FIG. 17, the threshold voltage of MOSFETs whose power supply voltage is in the range from 3.3 to 5 V is substantially the same as the potential at the nodes (a) and (b). Since this prevents a sufficient current from flowing, power on characteristics, stability and the like are deteriorated. Especially, since the potential at the nodes (a) and (b) is 0 V at the time of power on, the differential amplifier may be disabled to generate the reference voltage Vref.

According to the embodiment, since the relatively low voltages at the nodes (a) and (b) are received by p-channel type MOSFETs MP1 and MP2, a sufficient gatesource voltage can be maintained even when the threshold voltages of the MOSFETs MP1 and MP2 are set at great values as described above, which allows a greater amount of current to flow. This makes it possible to improve the power on characteristics, stability and the like.

In order to generate the reference voltage Vref based on the ground potential VSS, the base or emitter terminal of a bipolar transistor must be connected to the ground potential VSS. In order to operate it at a low power supply voltage, a driver constituted by a p-channel type MOSFET is required. When it is driven by a normal current mirror load type amplifier whose input is a p-channel type MOSFET, a sufficiently high level can not be achieved and a p-channel type MOS driver can not be cut off. According to this embodiment, this is solved by providing a push-pull conversion circuit having a double end configuration to maintain a sufficiently high level.

Specifically, a diode type n-channel MOSFET Q80 and an n-channel type MOSFET Q81 forming a current mirror with the same are connected between the drain of the p-channel type MOSFET MP1 forming the differential amplifier and the ground potential of the circuit. The MOSFET Q81 drives a diode type p-channel type MOSFET Q82 provided at the power supply voltage. A diode type n-channel MOSFET Q83 and an n-channel type MOSFET Q84 forming a current mirror with the same are connected between the drain of the other p-channel type MOSFET MP2 forming the differential amplifier and the ground potential of the circuit. The drain of the MOSFET Q84 and the drain of a p-channel type MOSFET Q85 connected to the p-channel type MOSFET Q82 in the form of a current mirror are connected to form a pushpull conversion circuit having a double end configuration. This push-pull circuit drives the p-channel type MOSFET MP3, thereby driving the transistors T3 and T4. A p-channel type MOSFET Q87 is normally connected to the ground potential of the circuit at the gate thereof to act as a resistive element which has a function of developing the potentials at the nodes (a) and (b) when the power is turned on. Therefore, a sufficiently high on resistance is set.

The present embodiment allows a stable operation at a sufficiently low power supply voltage even if the threshold voltage of the MOSFETs is high. This embodiment allows quick activation when the power is turned on and provides high stability.

Figure 33:
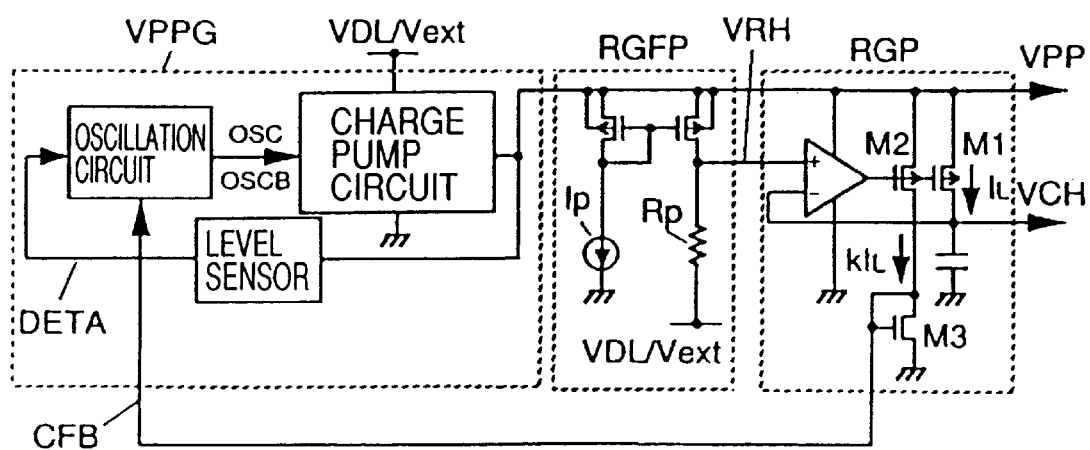
FIG. 33 is a circuit diagram of another embodiment of a power supply circuit according to the invention.

FIG. 33 is a circuit diagram of another embodiment of a power supply circuit according to the invention. The present embodiment is designed to allow the frequency of an oscillation pulse to operate the charge pump circuit to be varied in accordance with a load current.

In order to reduce the current consumption of the charge pump circuit, the oscillation circuit may have two different frequencies to be used in operation and in a standby state. In this configuration, however, the oscillation frequency must be determined in accordance with the maximum current in each mode. In a circuit operating on a low power supply voltage as described above, the threshold voltage of the MOSFETs must be decreased to allow operations at a high speed. As a result, even when the circuit is not operating as in a standby state, a relatively great sub-threshold leakage current can flow through the MOSFETs in an off state. Since this current undergoes an exponential change relative to temperature, the oscillation frequency must be set while taking it into consideration, which results in a problem in that the current consumption increases beyond the required amount.

Ad In the present embodiment, a p-channel type MOSFET M2 for current detection is provided in parallel with a p-channel type output MOSFET M1 for forming a boosting voltage VCH. The MOSFET M2 generates a detection current kIL in accordance with the ratio K of its size to the output MOSFET M1 and applies the current kIL to a diode type n-channel MOSFET M3 to supply a voltage signal CFB corresponding to it to the oscillation circuit and to cause the oscillation frequency to change continuously. That is, the oscillation circuit is controlled such that the oscillation frequency is increased in accordance with the increase of the detection current kIL.

Figure 34:
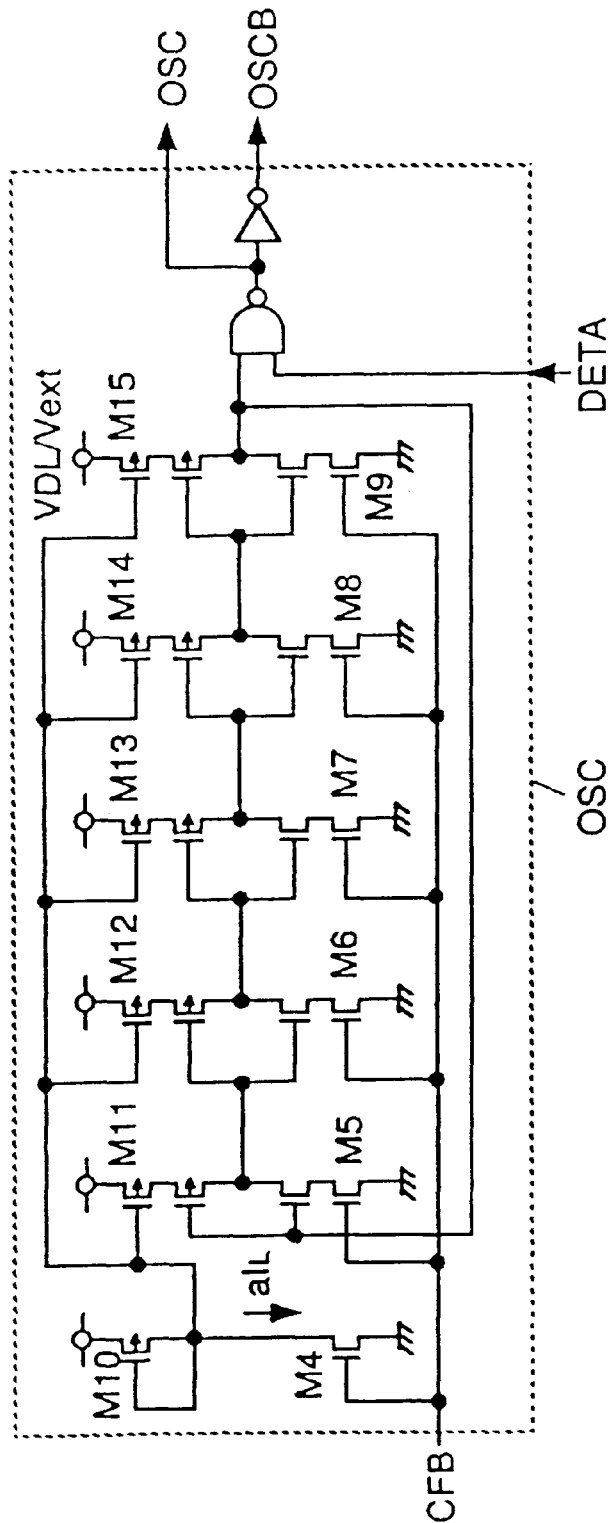
FIG. 34 is a circuit diagram of an embodiment of the oscillation circuit used in the power supply circuit of FIG. 33.

FIG. 34 is a circuit diagram of an embodiment of the oscillation circuit used in the circuit of the embodiment shown in FIG. 33. A ring oscillator formed by cascade-connecting inverter circuits in the form of a ring is used as the oscillation circuit. N-channel type MOSFETs M5 through M9 for supplying operating currents of the inverter circuits are combined with the n-channel type MOSFET M3 for current detection to form a current mirror configuration. That is, a signal CFB is supplied to the gate of each of the MOSFETs M5 through M9.

The signal CFB is supplied to the gate of the n-channel type MOSFET M4 so as to be converted into a current aIL which is applied to a diode type p-channel MOSFET M10. A current mirror circuit is formed by p-channel type MOSFETs M11 through M15 for applying an operating current to the inverter circuits to control the delay time of each of the inverter circuits in accordance with the signal CFB and to vary the delay time in inverse proportion to the increase of the current, thereby controlling the oscillation frequency.

When a load current IL of the power supply circuit increases, the oscillation frequency also increases to increase the number of charge pumping operations per unit time, which provides the power supply circuit with a current supplying capability in accordance with the increase of the load current. Since the duty ratio of the oscillation output pulse is maintained substantially constant, the efficiency of the charge pump circuit is also maintained substantially constant.

According to the present embodiment, even when the threshold voltage of the MOSFETs decreases or when the load current is increased by a high temperature, no shortage of current supplying capability occurs because the oscillation frequency of the oscillation pulse input to the charge pump circuit automatically increases in response. Further, since the oscillation frequency automatically decreases to reduce current consumption at a low temperature, the embodiment is suitable for power supply circuits provided in portable electronic apparatuses for which reduction of current consumption is important.

While the embodiment has been described with reference to a boosting circuit as an example, the embodiment may obviously applied to a negative charge pump circuit for generating a negative voltage similarly.

Figure 35:
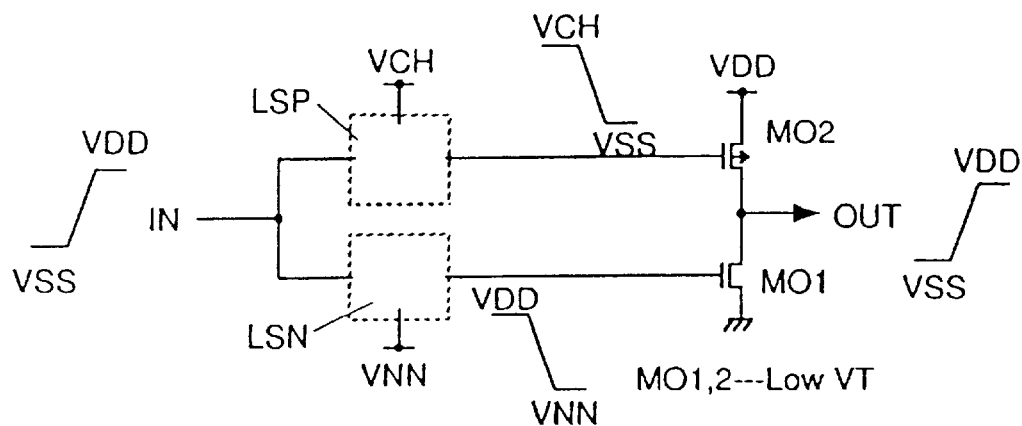
FIG. 35 is a circuit diagram of an embodiment of an output circuit according to the invention.

FIG. 35 is a circuit diagram of an embodiment of an output circuit according to the invention. The present embodiment is directed to a push-pull output circuit which is designed such that the driving capability can be enhanced while reducing the leakage current. Like the sense amplifier driving circuit shown in FIG. 1, in the circuit of this embodiment, an n-channel type driving MOSFET M01 and a p-channel type driving MOSFET M02 have a low threshold voltage to enhance the driving capability. In order to reduce a direct current (short circuit current) that flows through both of the MOSFETs M01 and M02 attributable to a sub-threshold leakage current in an off state of the MOSFET M01 or M02, level conversion circuits LSN and LSP are provided to generate an input signal which causes reverse biasing of the voltage applied between the sources and gates of the MOSFETs M01 and M02 in an off state.

The level conversion circuit LSN receives an input signal VSS–VDD and converts the level into VDD–VNN. Therefore, when the voltage VNN is output, a reverse bias voltage VNN–VSS is applied between the gate and source of the MOSFET M01. The other level conversion circuit LSP receives an input signal VSS–VDD and converts the level into VCH–VSS. Therefore, when the voltage VCH is output, a reverse bias voltage VDD–VCH is applied between the gate and source of the MOSFET M02.

The voltage VDD may be generated in the semiconductor integrated circuit device and, alternatively, an operating voltage supplied through an external terminal may be used as it is.

According to the present embodiment, the driving capability of a CMOS (push-pull) circuit is enhanced by reducing the threshold voltage of the output MOSFET, and level conversion circuits are used as driving circuits for driving the same to set a signal level to establish an off state and for setting it at a voltage which results in a reverse bias state between the gate and source of the MOSFETs. This makes it possible to suppress any short circuit current attributable to a sub-threshold leakage current. The present embodiment is therefore suitable for circuits or systems operating on a low voltage of 3 V or less.

Figure 36:
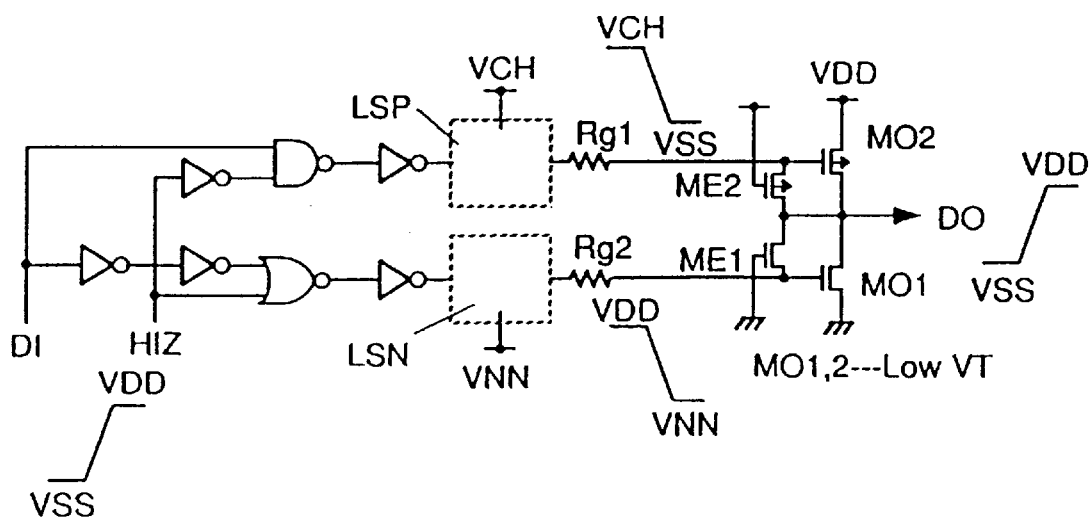
FIG. 36 is a circuit diagram of an embodiment which is an application of an output circuit according to the invention to an output buffer.

FIG. 36 is a circuit diagram of an embodiment in which an output circuit according to the invention is applied to an output buffer. The output buffer of this embodiment also makes it possible to suppress any short circuit current attributable to a sub-threshold leakage current while enhancing the driving capability. In the circuit of this embodiment, resistors Rg1 and Rg2 and gate protection MOSFETs ME2 and ME1 are inserted between level conversion circuits LSP and LSN and the gates of output MOSFETs M02 and M01.

The resistors Rg1 and Rg2 have a function of preventing overshoot or undershoot by expanding the time of change of the gate voltage of a driving MOSFET to reduce the steepness of rising and falling waveforms of the output.

The gate protection MOSFETs ME1 and ME2 have a function of preventing the gate insulation films (oxide films) of the output MOSFETs M01 and M02 from being broken when an external high voltage is applied to an output terminal DO. Specifically, when a potential at the output terminal DO increases beyond a power supply voltage VDD, the p-channel type MOSFET ME1 is turned on to short the gate of the output MOSFET M02 and the output terminal DO. When the potential at the output terminal DO is below a ground potential VSS, the n-channel type MOSFET ME2 is turned on to short the gate of the output MOSFET M01 and the output terminal DO, thereby preventing the high voltage from being applied to the gate insulation films.

According to this embodiment, separate input signals are input to the level conversion circuits LSN and LSP through a control circuit formed by a gate circuit controlled by an output control signal HIZ, an inverter circuit and the like. This control circuit prevents any short circuit current from flowing through the output buffer and turns both of the output MOSFETs M01 and M02 off to achieve a high impedance state at the output.

In the circuit of this embodiment as described above, any short circuit current attributable to a sub threshold leakage current can be suppressed while enhancing the driving capability with the push-pull type output buffer. The present embodiment is therefore suitable for circuits or systems operating on a low voltage of 3 V or less.

The above-described embodiments of the invention provide the advantages described below.

(1) in a semiconductor integrated circuit device including a first circuit block operating on a power supply voltage supplied through an external terminal and a second circuit block operating on an internal voltage generated by a power supply circuit, a voltage having an absolute value greater than that of the internal voltage is generated by a charge pump circuit; variable impedance means is provided between the output voltage and the internal voltage; and a differential amplifier circuit operating on the output voltage generated by the charge pump circuit controls the variable impedance means to compare a reference voltage and the internal voltage and to cause them to agree with each other, thereby forming the internal voltage. This results in an advantage in that an arbitrary internal voltage can be generated with stability.

(2) By providing two types of power supply circuits as described above, an advantage can be provided in that the power supply circuits can generate, with stability, a voltage having the same polarity as the voltage supplied through the external terminal and having a greater absolute value or a voltage having a polarity different from that of the voltage supplied through the external terminal.

(3) A word line select level and a non-select level which is a negative voltage of the dynamic RAM are generated by the power supply circuit, which is advantageous in that the data retention characteristics of a memory cell can be improved and a high reliability of the devices can be maintained.

(4) A differential amplifier circuit normally operating on a small current only sufficient to maintain the internal voltage and a differential amplifier circuit operating on a large current required to maintain the internal voltage in adaptation to an operating state of internal circuits are combined in the power supply circuit to provide an advantage in that a required voltage can be generated with low power consumption.

(5) An output voltage generated by the charge pump circuit of the first power supply circuit is applied to an n-type well region at the depth of a p-type well region where the dynamic memory cell is formed. This is advantageous in that the parasitic capacitance in such a region can be utilized and in that no special measures for latch up are required.

(6) The output voltage generated by the charge pump circuit of the second power supply circuit is also used as a substrate back bias voltage applied to the p-type well region where the dynamic memory cell is formed. This is advantageous in that the junction capacitance can be utilized, in that software errors attributable to α-rays can be reduced and in that simplification can be achieved by the shared circuit.

(7) The internal circuit is formed by a third power supply circuit for decreasing the power supply voltage supplied through the external terminal to generate a constant voltage and a circuit region operated by the low voltage generated by the third power supply circuit. This is advantageous in that the internal circuit can be operated with stability without depending on an external power supply.

(8) In the output circuit forming a part of the internal circuit and for outputting a high level generated by the first power supply circuit and a low level generated by the second power supply circuit, a MOSFET of a first conductivity type supplied with the ground potential at the gate thereof and a MOSFET of a second conductivity type supplied with the internal voltage at the gate thereof are respectively provided in series with an output MOSFET of the first conductivity type for outputting the internal voltage generated by the first power supply circuit and an output MOSFET of the second conductivity type for outputting the internal voltage generated by the second power supply circuit. This is advantageous in that high reliability can be maintained because the voltage applied to each MOSFET can be divided.

(9) A first driving circuit for generating a driving signal supplied to the gate of the output MOSFET of the first conductivity type that constitutes the output circuit is a first level conversion circuit for converting an input signal generated by an internal circuit operating on the power supply voltage or internal low voltage or the ground potential of the circuit into a first signal level associated with the output voltage of the first power supply circuit and the ground potential of the circuit. A second driving circuit for generating a driving signal supplied to the gate of the output MOSFET of the second conductivity type that constitutes the output circuit is a second level conversion circuit for converting the input signal into a second signal level associated with the internal voltage and the output voltage of the second power supply circuit. This is advantageous in that the voltage applied to the output MOSFETs can be suppressed to maintain higher reliability.

(10) The gate insulation film of the address selection MOSFET forming a part of the dynamic memory cell and the gate insulation film of the output MOSFET for generating the selection signal for the word line are set at the same first thickness; and the gate insulation films of the MOSFETs that constitute the sense amplifier and the address selection circuit are set at a second thickness smaller than the first thickness. This is advantageous in that both high reliability and high speed operation can be achieved.

(11) The internal circuit is constituted by a plurality of circuits which are geometrically separated from each other. The power supply circuit is constituted by a plurality of first power supply circuits associated with the plurality of circuits in a one-to-one relationship for generating a voltage having the same polarity as the voltage supplied through the external terminal and a greater absolute value than the same and a plurality of second power supply circuits for generating a voltage having a polarity different from that of the voltage supplied through the, external terminal. The first and second power supply circuits share the first and second charge pump circuits and have a plurality of said variable impedance means and differential amplifier circuits provided adjacent to respective ones of the plurality of circuits. This is advantageous in that the circuit can be simplified and in that an operating voltage can be efficiently supplied.

(12) A memory cell array in the form of a matrix of a plurality of dynamic memory cells is divided into a plurality of parts. The first and second charge pump circuits are shared by the first and second power supply circuits. A plurality of differential amplifiers and variable impedance means are provided corresponding to each memory array. This is advantageous in that the circuit can be simplified; an operating voltage can be efficiently supplied; and the storage capacity can be increased.

(13) As the internal circuit, a single chip microcomputer is used which includes a central processing unit, a flash EPROM and an analog-to-digital conversion circuit. The first and second power supply circuits generate positive and negative voltages used for operations of the flash EPROM and analog-to-digital conversion circuit. This is advantageous in that stored information can be erased at one time on a chip and in that an analog signal can be input as it is without using a coupling capacitor.

(14) The internal circuit is equipped with a p-channel type MOSFET for outputting the power supply voltage or a voltage equal to or lower than the same and an n-channel type MOSFET for outputting a ground potential of the circuit and a circuit for using the output voltage of the first power supply circuit or the output voltage of the charge pump as a signal level for turning the p-channel MOSFET off and for using the output voltage of said second power supply circuit or the output voltage of the charge pump as a signal level for turning the n-channel type MOSFET off. This is advantageous in that the MOSFETs can be turned off with a reverse bias between the sources and gate thereof to reduce the threshold leakage current significantly.

(15) The reference voltage is generated with a voltage-to-current conversion circuit for converting a constant voltage generated using a silicon bandgap formed in accordance with an emitter current density difference into a constant current by passing the constant current through one or a plurality of current mirror circuits that constitute the power supply circuit to which a charge pump voltage is applied to convert it into a constant current, the constant current being applied to one end of a resistor which is connected to a predetermined internal voltage terminal. This is advantageous in that voltage setting can be easily carried out with high accuracy and high stability.

(16) One end of a first resistor having a great resistance is connected to the emitter of a first transistor formed with a small emitter area and connected to the ground potential of the circuit at the base and collector thereof which have a common configuration, one end of a second resistor having a resistance which is negligibly small compared to the resistance of the first resistor is connected to the emitter of a second transistor formed with a large emitter area and connected to the ground potential of the circuit at the base and collector thereof which have a common configuration. A third resistor having a high resistance which is substantially the same as that of the first resistor is connected to the other end of the second resistor at one end thereof A differential amplifier circuit including a p-channel type differential MOSFET which receives a potential at the emitter of the first transistor and a potential at the node between the second and third resistors is used to generate a voltage such that both of the voltages agree with each other and to supply the voltage to the other ends of the first and third resistors which are commonly connected, thereby generating the constant voltage. This is advantageous in that a constant voltage can be generated with stability even in a low voltage region.

(17) The power supply circuit is provided with a current sense MOSFET whose gate and source are commonly connected to the MOSFET that constitutes the variable impedance means for generating a sense current in accordance with a load current with a small MOSFET in accordance with a size ratio of the same, and a pumping period of the charge pump circuit is controlled in response to an oscillation pulse generated by an oscillation circuit having an oscillation frequency which is varied in accordance with the sense current. This is advantageous in that the efficiency of the charge pump circuit can be improved.

While the invention conceived by the inventors has been specifically described with reference to preferred embodiments thereof, the invention is not limited to those embodiments and may obviously modified in various ways within the scope of the principle thereof. For example, various modes are possible for the specific configuration and layout of each circuit forming the dynamic RAM. The constant voltage circuit may be implemented in various modes including the use of source follower MOSFETs applied with a constant voltage at the gate thereof in addition to the MOSFETs used as differential amplifier circuits and variable resistive elements. The input/output interface of the dynamic RAM may be provided in various modes for implementation such as an interface adapted to a synchronous DRAM and an interface adapted to LAN bus specifications.

The present invention may be widely used in various semiconductor integrated circuit devices including dynamic RAMs, single chip microcomputers and as described above, in devices which require an internal voltage different from a voltage supplied through an external terminal.

What is claimed:

1. A semiconductor integrated circuit device comprising:

a first voltage terminal for receiving a first voltage;

a second voltage terminal for receiving a second voltage, a first differential amplifier including a first MOSFET of P-channel type having a source connected to a first node, a second MOSFET of P-channel type having a source connected to said first node, a current source connected between said first voltage terminal and said first node, a third MOSFET having a source-drain path connected between a drain of said first MOSFET and said second voltage terminal and a fourth MOSFET having a source-drain path connected between a drain of said second MOSFET and said second voltage terminal;

a push-pull circuit which outputs a signal on the basis of a current difference between a source-drain current of said third MOSFET and a source-drain current of said fourth MOSFET;

an output MOSFET having a gate receiving said signal and a source-drain path connected between said first voltage terminal and an output terminal; and a signal generator including a first diode-configured transistor having a cathode connected to said second voltage terminal, a second diode-configured transistor having a cathode connected to said second voltage terminal, a first load connected between said output terminal and an anode of said first diode-configured transistor, and a second load connected between said output terminal and an anode of said second diode-configured transistor, wherein a gate signal of said first MOSFET is derived from said first load and a gate signal of said second MOSFET is derived from said second load.

2. A semiconductor integrated circuit device according to claim 1, wherein an emitter area of said first diode-configured transistor is smaller than an emitter area of said second diode-configured transistor.

3. A semiconductor integrated circuit device according to claim 1, further comprising a second differential amplifier having a reference terminal connected to said output terminal.

* * * * *